(12) United States Patent
Hosokawa et al.

(10) Patent No.: US 6,292,915 B1
(45) Date of Patent: *Sep. 18, 2001

(54) METHOD OF DESIGN FOR TESTABILITY AND METHOD OF TEST SEQUENCE GENERATION

(75) Inventors: Toshinori Hosokawa, Osaka; Tomoo Inoue, Nara; Hideo Fujiwara, Kyoto, all of (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/009,928

(22) Filed: Jan. 21, 1998

(30) Foreign Application Priority Data

Jan. 22, 1997 (JP) .................................................... 9-009370

(51) Int. Cl.[7] .................................................. G01R 31/28
(52) U.S. Cl. ................................ 714/726; 714/738; 716/5
(58) Field of Search .................................... 714/726–729, 714/738, 724; 716/4, 5

(56) References Cited

U.S. PATENT DOCUMENTS

| 5,513,118 | * | 4/1996 | Dey et al. | ........................ 395/500.19 |
| 5,522,063 | * | 5/1996 | Ashar et al. | ........................ 395/500 |
| 5,726,996 | * | 3/1998 | Chakradhar et al. | ................. 714/724 |
| 6,185,721 | * | 2/2001 | Hosokawa | ................................ 716/5 |

FOREIGN PATENT DOCUMENTS 5-203708    8/1993    (JP) .

OTHER PUBLICATIONS

Lejmi, S et al. (Synthesis and retiming for the pseudo-exhaustive BIST of synchronous sequential circuits; IEEE, Oct. 21–25, 1995).*
Lejmi, S et al. (Retiming for BIST–sequential circuits; IEEE, May 3, 1995).*
Boppana, V. et al. (Partial scan design based on state transition modeling; IEEE, Oct. 25, 1996).*
Kwang–Ting Cheng (Partial scan designs without using a separate scan clock ; IEEE, May 3, 1995).*

(List continued on next page.)

*Primary Examiner*—Albert Decady
*Assistant Examiner*—Guy Lamarre
(74) *Attorney, Agent, or Firm*—McDermott, Will & Emery

(57) ABSTRACT

The invention provides a method of design for testability at RTL which can guarantee high fault coverage and a method of test sequence generation for easily generating test sequences for an RTL circuit which is designed to be easily testable by the method of design for testability. In the RTL circuit, scannable registers are selected so that the RTL circuit can attain an easily testable circuit structure such as an acyclic structure. This RTL circuit is timeframe expanded on the basis of a predetermined evaluation function and logically synthesized, so as to generate a timeframe expanded combinational circuit, that is, a gate level timeframe expanded circuit, as a circuit for test sequence generation. For the timeframe expanded combinational circuit, test patterns for multiple stuck-at faults are generated, the test patterns are transformed into test sequences on the basis of data on timeframes including primary inputs and pseudo-primary inputs, and the test sequences are transformed into scanning test sequences in view of a scan shift operation.

14 Claims, 40 Drawing Sheets

OTHER PUBLICATIONS

Chih–Chang Lin et al (Scan paths through functional logic; IEEE, May 5–8, 1996).*

Gupta et al.(Testability Properties of Acyclic Structures and Applications to Partial Scan Design; IEEE, Apr. 1992).*

Mourad (Digital Design with Minimal Number of Scan Flip–Flops; IEEE, Oct. 1996).*

Hosokawa, T., et al., "A Partial Scan Design Method Based on N–Fold Line–Up Structures" Proceedings Sixth Asian Test Symposium (AT'97) Akita, Japan Nov. 17–19, 1997, Instutute of Electrical and Electronics Engineers, pp. 306–311.

A. Kunzmann, et al., An Analytical Approach to the Partial Scan Problem:, Journal of Electronic Testing: Theory and Applications, 1, pp. 163–174, 1990.

A. Motohara, et al., "A State Traversal Algorithm Using A State Covariance Matrix", Proc. of 30th AMC/IEEE Design Automation Conference, pp. 97–101, 1993.

R. Gupta, et al., Partial Scan Design of Register–Transfer Level Circuits:, Journal of Electronic Testing: Theory and Applications, 7, pp. 25–46, 1995.

A. Motohara, et al., "Design for Testability Using Register Transfer Level Partial Scan Selection", Proc. of Asia and South pacific Design Automation Conference, pp. 209–215, 1995.

T. Inoue et al., "An RT Level Partial Scan Design Method Based on Combinational ATPG", Technical Report of the Institute of Electronics, Informantion and Communication Engineers, vol. 96, No. 519, pp. 73–80, Feb. 13, 1997.

H. Fujiwara et al., "Sequential Circuit Structure With Combinational Test Generation Complexity and its Application", The Transactions of the Institute of Electronics, Information and Communication Engineers, vol. J80–D–I, No. 2, pp. 155–163, Feb. 1997.

C. A. Njinda et al., "A Fully Integrated CAD Environment for Designing Testable VLSI Circuit", Wescon Conference Record, vol. 36, pp. 224–230, 1992.

A. Motohara et al., "A Partial Scan Design Approach Based on Register Transfer Level Testability Analysis", IEICE Trans. Inf. & Syst., vol. E79–D, No. 10, pp. 1436–1442, Oct. 1996.

A. Motohara et al., "Design for Testability in a Graphical Functional Design System Environment", Technical Report of the Institute of Electronics, Information and Communication Engineers, vol. 93, No. 506, pp. 95–102, Mar. 10, 1994.

S. Ohtake et al., "An Approach to Sequential Test Generation by Circuit Pseudo–Transformation", Technical Report of the Institute of Electronics, Information and Communication Engineers, vol. 96, No. 291, pp. 9–16, Oct. 9, 1996.

A. Motohara et al., "Full Top Down Design for Testability Using Multi–Level Partial Scan Design", Technical Report of the Institute of Electronics Information and Communication Engineers, vol. 95, No. 561, Mar. 7, 1996.

* cited by examiner

METHOD OF DESIGN FOR TESTABILITY AND METHOD OF TEST SEQUENCE GENERATION

BACKGROUND OF THE INVENTION

The present invention relates to design for testability and test sequence generation for integrated circuits (LSIs). More particularly, it relates to techniques to design for testability for an RTL circuit, that is, an integrated circuit designed at register transfer level (RTL).

A typical example of the conventional method of design for testability includes scan design. In the scan design, a flip-flop (FF) included in a logically designed LSI is replaced with a scan FF which can be externally directly controlled (scanned in) and observed (scanned out), so that a problem of a sequential circuit can be simplified into a problem of test pattern generation of a combinational circuit. Thus, test sequences can be easily generated ("Digital Systems Testing and Testable DESIGN, Chapter 9, Design For Testability", 1990, published by Computer Science Press).

The conventional scan design includes full scan design in which all FFs are replaced with scan FFs and partial scan design in which merely FFs difficult to observe and control are replaced with scan FFs so as to overcome problems such as increase in hardware overhead occurring in the full scan design, both of which are executed mainly at gate level.

However, according to the conventional partial scan design at gate level, an operation timing of a gate level circuit generated through the logic synthesis can be harmfully affected by the scan design, so that a normal operation cannot be guaranteed. Therefore, re-design of the circuit is required, which can cause a problem that the design takes a long period of time.

As a countermeasure, partial scan design at register transfer level (RTL) with higher abstraction than the gate level is recently proposed.

For example, in an integrated circuit designed at RTL (i.e., an RTL circuit), registers to be made scannable (hereinafter referred to as scannable registers) are selected by using a testability measure or the like within a specified range of scan ratio (1995, ASPDAC (Asia and South Pacific Design Automation Conference), pp. 209–216, "Design For Testability Using Register Transfer level Partial Scan Selection").

However, in the partial scan design at RTL, it is difficult to achieve high fault coverage at RTL. Specifically, in the RTL partial scan design, the fault coverage is to be increased as far as possible within the specified range of scan ratio, and therefore, it is necessary to repeat a series of procedures of selection of registers to replace with scan registers, logic synthesis, insertion of a scan path and test sequence generation until high fault coverage is achieved. Accordingly, the entire scan design requires a long period of time, resulting in disadvantageously increasing a cost for the design for testability.

SUMMARY OF THE INVENTION

The present invention provides a method of design for testability for modifying design of an integrated circuit at RTL so as to attain testability, by which high fault coverage can be guaranteed at RTL.

Also, the invention provides a method of test sequence generation for easily generating test sequences for a circuit having an easily testable circuit structure such as an RTL circuit whose design is modified to be easily testable by the method of design for testability.

Specifically, the method of design for testability of this invention for modifying design of an RTL circuit, that is, an integrated circuit designed at register transfer level, so as to attain testability after manufacture, comprises a first step of specifying an easily testable circuit structure; and a second step of selecting scannable registers among registers included in the RTL circuit so that the RTL circuit in test has the easily testable circuit structure specified in the first step in assuming a normal data input of a scannable register as a pseudo-primary output and a data output thereof as a pseudo-primary input.

According to the method of design for testability, scannable registers are selected so that the RTL circuit has the easily testable circuit structure specified in the first step. Therefore, high fault coverage can be guaranteed in upper stage of design. Furthermore, since the design for testability is performed at RTL, re-design can be largely avoided, and time required for the design of an LSI can be shortened as compared with time conventionally required.

Also, the method of test sequence generation, of this invention, for an RTL circuit, that is, an integrated circuit designed at register transfer level, the RTL circuit having an acyclic structure or having a structure in which scannable registers are selected and an acyclic structure is attained in assuming a normal data input of a scannable register as a pseudo-primary output and a data output thereof as a pseudo-primary input, comprises a first step of converting the RTL circuit into a timeframe expanded combinational circuit, that is, a gate level timeframe expanded circuit; a second step of generating test patterns for the timeframe expanded combinational circuit generated in the first step; and a third step of transforming the test patterns generated in the second step into test sequences for the sequential circuit on the basis of data on timeframes including each of primary inputs and pseudo-primary inputs of the timeframe expanded combinational circuit generated in the first step.

According to the method of test sequence generation, the RTL circuit is converted, in the first step, into the gate level timeframe expanded combinational circuit for which test patterns can be easily generated, the test patterns for a combinational circuit are generated for the timeframe expanded combinational circuit in the second step, and the test patterns are transformed into test sequences for a scannable sequential circuit in the third step. In this manner, the test sequences for the sequential circuit can be easily generated.

BRIEF DESCRIPTION OF THE DRAWINGS

FIGS. 33(a) and 33(b) are diagrams resulting from the timeframe expansion of the seventh embodiment on the RTL circuit of FIG. 31, wherein FIG. 33(a) shows a result obtained when a primary output PO2 is disposed in a timeframe 4 and FIG. 33(b) shows a result obtained when the primary output PO2 is disposed in a timeframe 3;

FIGS. 34(a) and 34(b) are diagrams for showing results of conversion of the timeframe expanded RTL circuits of FIGS. 33(a) and 33(b) into gate level circuits, wherein FIG. 34(a) shows the result obtained from FIG. 33(a) and FIG. 34(b) shows the result obtained from FIG. 33(b);

FIGS. 36(a) through 36(c) are directed graphs for showing structures of blocks in the RTL circuit of FIG. 35, wherein FIG. 36(a) shows the structure of a block A, FIG. 36(b) shows the structure of a block B and FIG. 36(c) shows the structure of a block C;

DETAILED DESCRIPTION OF THE INVENTION (Embodiment 1)

Figure 1:
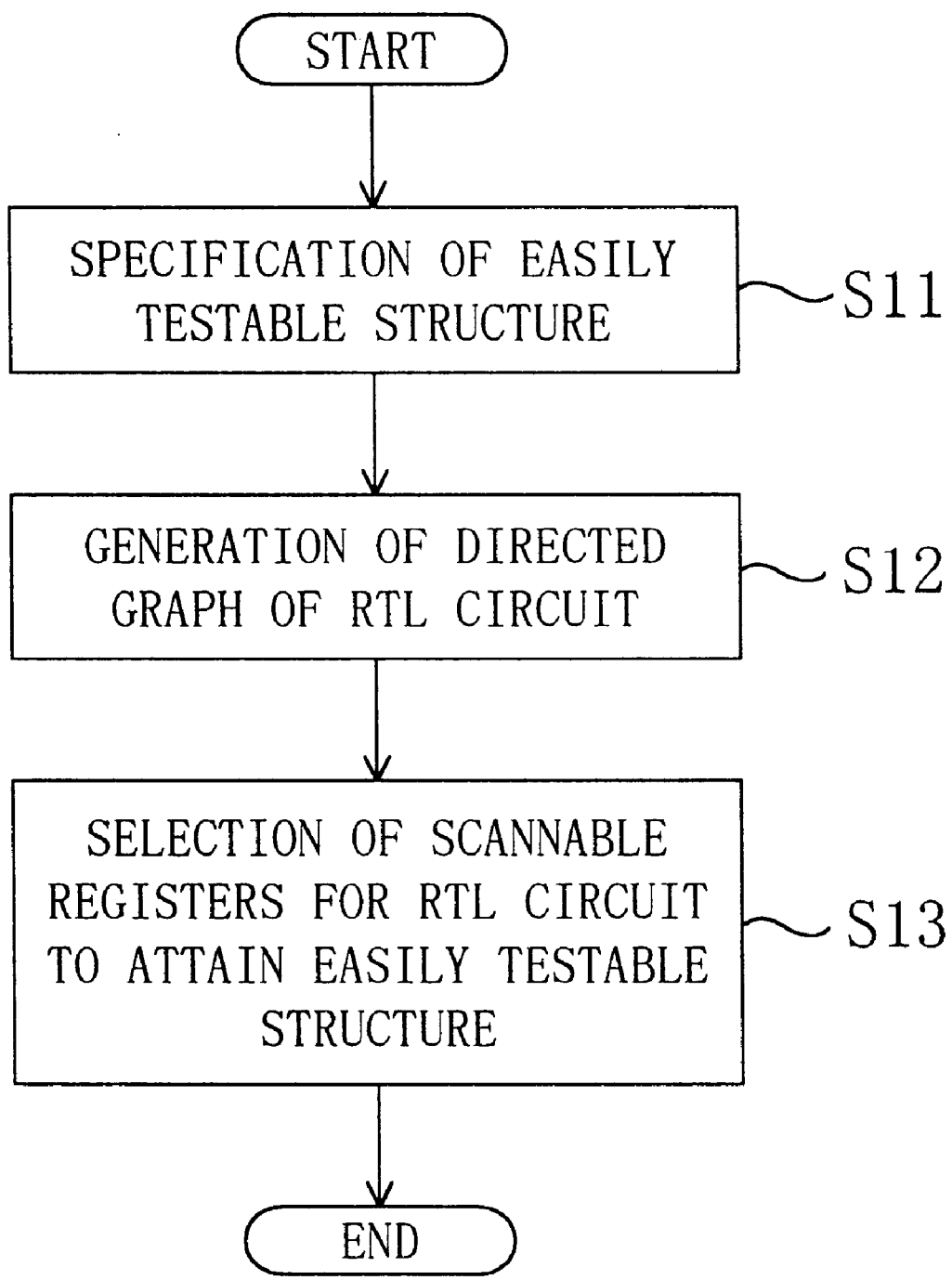
FIG. 1 is a flowchart for showing procedures in a method of design for testability according to a first embodiment of the invention.

FIG. 1 is a flowchart for showing procedures in a method of design for testability according to a first embodiment of the invention. As is shown in FIG. 1, in step S11, an easily testable circuit structure is specified; in step S12, a directed graph is generated on the basis of RTL design data of an RTL circuit, that is, an integrated circuit designed at register transfer level (RTL); and in step S13, registers to be replaced with scan registers (namely, scannable registers) are selected in the directed graph generated in step S12 so that the RTL circuit can attain the easily testable circuit structure specified in step S11.

In step S11, an acyclic structure, an n-fold line-up structure (wherein n is a natural number) or a structure with combinational test pattern generation complexity is specified as the easily testable circuit structure.

An acyclic structure means a circuit structure including no feedback loops. An n-fold line-up structure means a circuit structure in which paths between an arbitrary pair of a register of the circuit and a primary output or a pseudo-primary output have n or less sequential depths. A circuit having the n-fold line-up structure has a characteristic that each of the numbers of timeframes including each register is limited to n or less in timeframe expansion with respect to the arbitrary primary or pseudo-primary output. Also, a structure with combinational test pattern generation complexity means a structure with complexity applicable to a test pattern generation algorithm for a combinational circuit.

Figure 2:
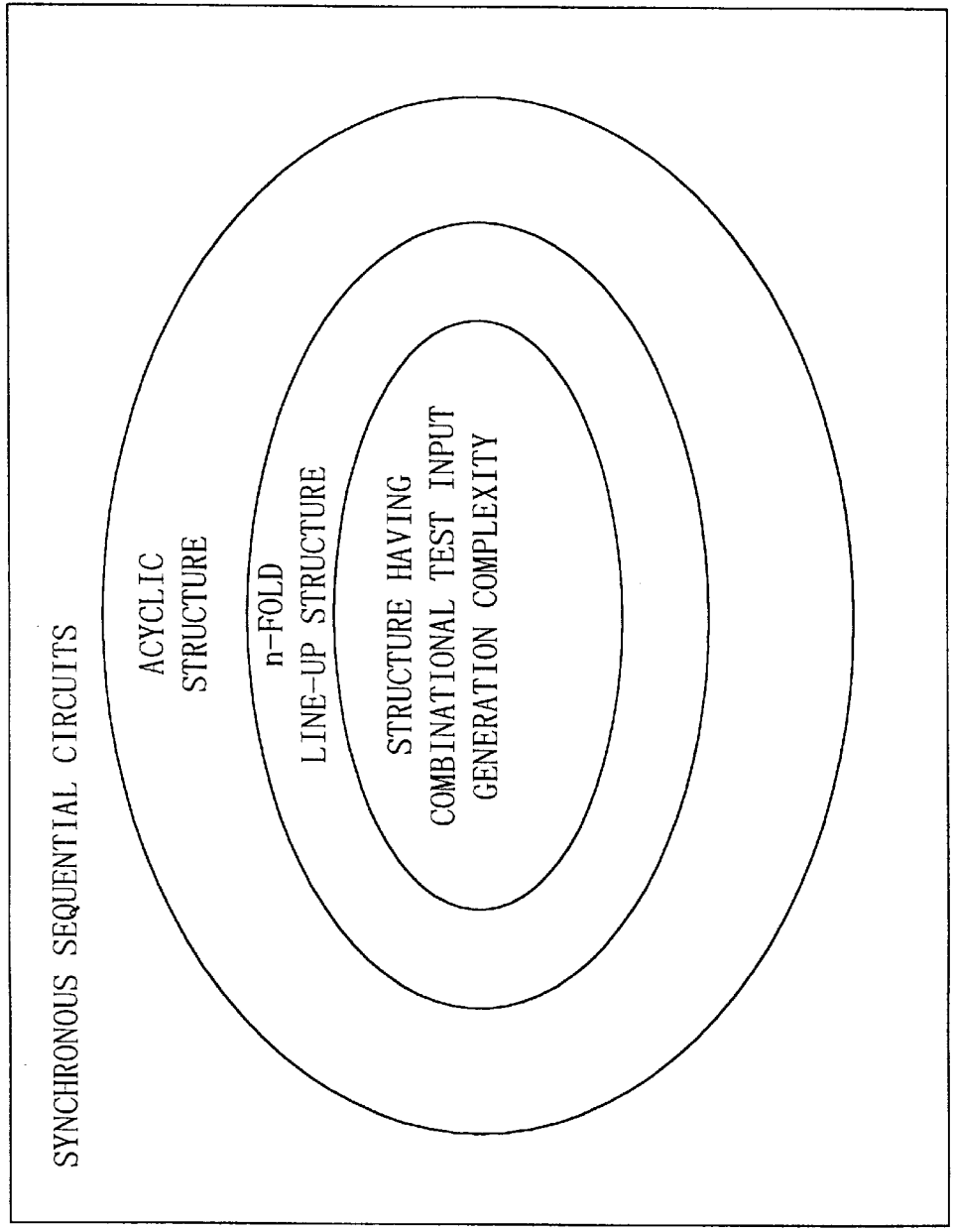
FIG. 2 is a diagram for illustrating classification in structures of synchronous sequential circuits.

FIG. 2 is a diagram for showing classification in structures of synchronous sequential circuits. As is shown in FIG. 2, the acyclic structure includes the n-fold line-up structure, and the n-fold line-up structure includes the structure with combinational test pattern generation complexity.

Furthermore, in the directed graph generated in step S12, facilities such as a combinational facility and a register are expressed as nodes and data transfer between the nodes is expressed as an edge. With regard to an RTL circuit including a finite state machine, a directed graph is generated after the entire RTL circuit is expressed by connections among registers and combinational facilities by logically synthesizing the finite state machine alone.

In step S13, scannable registers are selected so that the RTL circuit has the easily testable circuit structure specified in step S11 in assuming a normal data input of a scannable register as a pseudo-primary output and a data output thereof as a pseudo-primary input.

Now, the method of design for testability of this embodiment will be described by exemplifying a specific circuit with reference to FIGS. 3 through 6.

Figure 3:
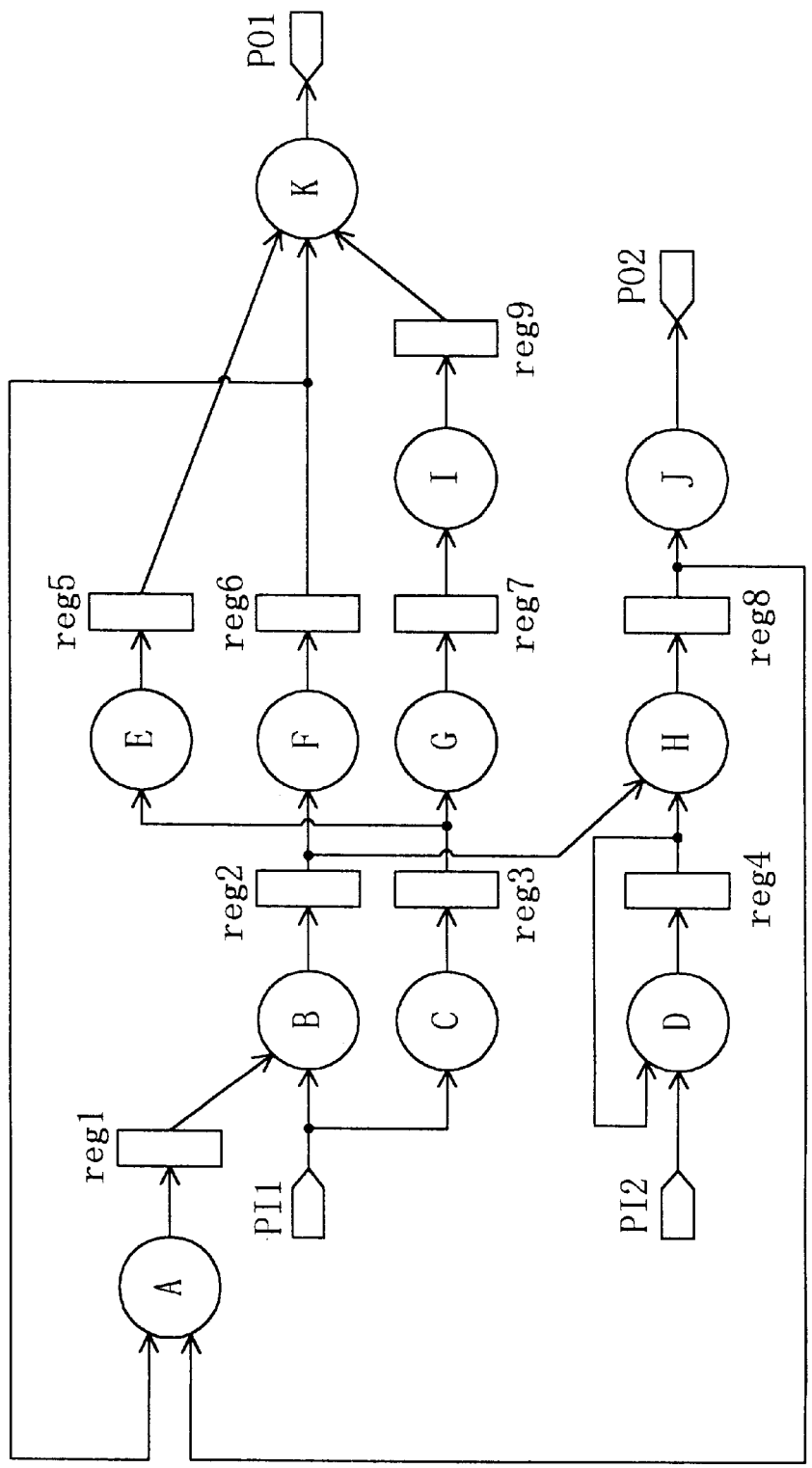
FIG. 3 is a directed graph for showing an example of an RTL circuit applicable to the method of design for testability of the first embodiment.

FIG. 3 shows a directed graph for showing an example of the RTL circuit applicable to the method of design for testability of this embodiment, generated on the basis of RTL design data in step S12. In FIG. 3, A through K indicate combinational facilities, reg1 through reg9 indicate registers, PI1 and PI2 indicate primary inputs, and PO1 and PO2 indicate primary outputs. The directed graph as is shown in FIG. 3 can be expressed as a chart or expressed by a hardware description language such as Verilog-HDL in the actual design for testability.

Figure 4:
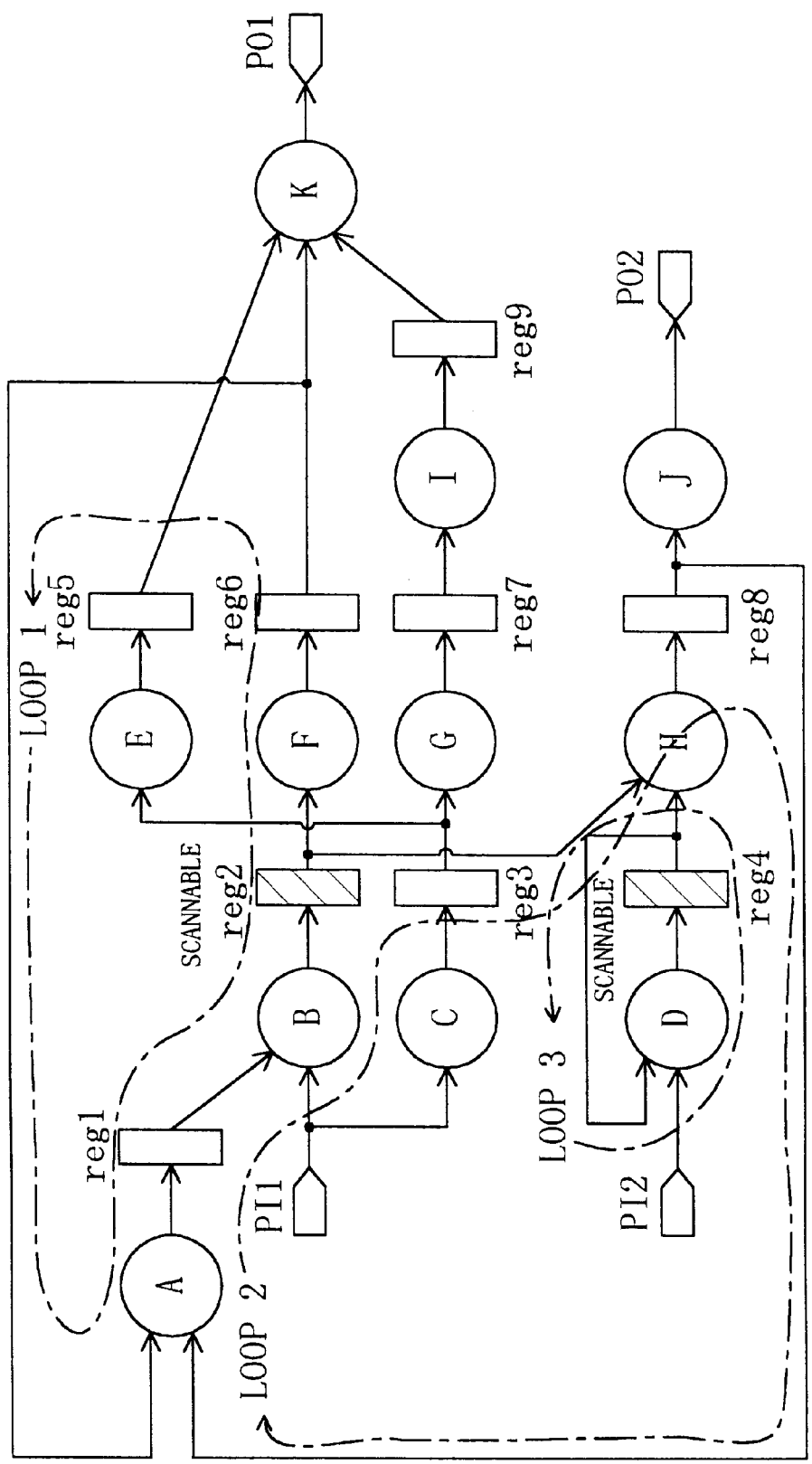
FIG. 4 is a directed graph for showing selection of scannable registers in the RTL circuit of FIG. 3 in the case where an acyclic structure is specified as an easily testable circuit structure.

FIG. 4 is a directed graph for showing selection of scannable registers in step S13 about the RTL circuit of FIG. 3 in the case where the acyclic structure is specified as the easily testable circuit structure in step S11. As is shown in FIG. 4, the original directed graph includes three feedback loops: a loop 1 consisting of the registers reg1, reg2 and reg6 and the combinational facilities A, B and F; a loop 2 consisting of the registers reg1, reg2 and reg8 and the combinational facilities A, B and H; and a loop 3 consisting of the register reg4 and the combinational facility D. Since both the loop 1 and the loop 2 include the registers reg1 and reg2, the loops 1 and 2 can be broken by replacing either the register reg1 or reg2 with a scan register. Also, the loop 3 can be broken by replacing the register reg4 with a scan register. Therefore, as is shown in FIG. 4, the hatched registers reg2 and reg4 are selected as the scannable registers.

Figure 5:
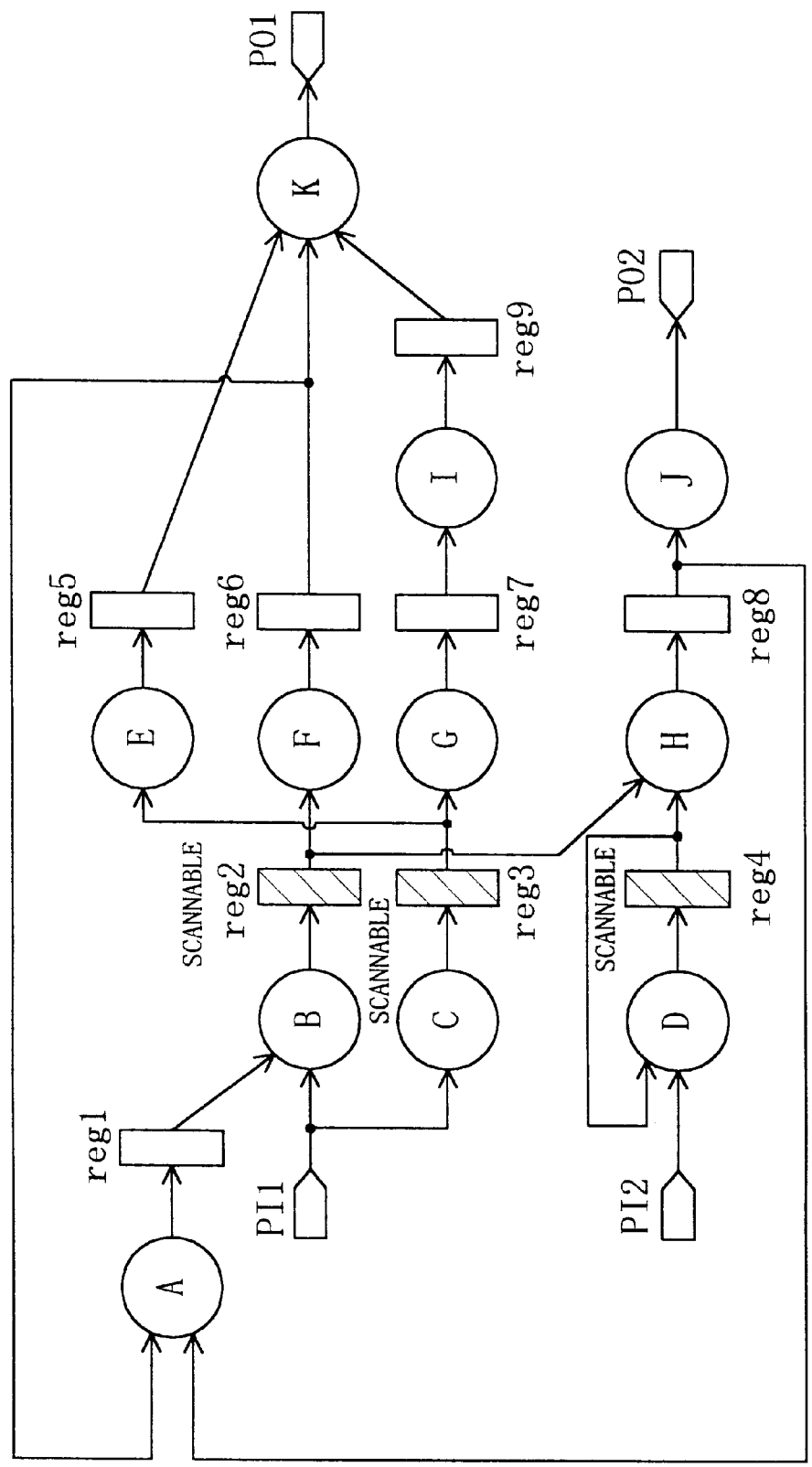
FIG. 5 is a directed graph for showing selection of scannable registers in the RTL circuit of FIG. 3 in the case where a one-fold line-up structure is specified as the easily testable circuit structure.

FIG. 5 is a directed graph for showing selection of scannable registers in step S13 about the RTL circuit of FIG. 3 in the case where a one-fold line-up structure is specified as the easily testable structure in step S11. A one-fold line-up structure is the n-fold line-up structure when n=1, namely, a structure in which paths between a given register and a given primary output or pseudo-primary output have one sort of sequential depth. In other words, in a one-fold line-up structure, paths between one register and a given primary output or pseudo-primary output do not pass through this register and the paths have merely one sort of the number of registers.

As is shown in FIG. 5, in the original directed graph, the registers reg1, reg2, reg4, reg6 and reg8 have paths passing therethrough, and paths between the register reg3 and the primary output PO1 have two sorts of the number of the registers (namely, two registers and one register). Therefore, the original directed graph does not have the one-fold line-up structure. At this point, when the registers reg2 and reg4 are replaced with scan registers as is shown in FIG. 5, none of the registers has a path passing therethrough, and when the register reg3 is replaced with a scan register, the paths between the each register and the primary outputs or pseudo-primary outputs have one sort of the number of registers. Thus, the one-fold line-up structure can be attained. Accordingly, the registers reg2, reg3 and reg4 hatched in FIG. 5 are selected as the scannable registers.

Figure 6:
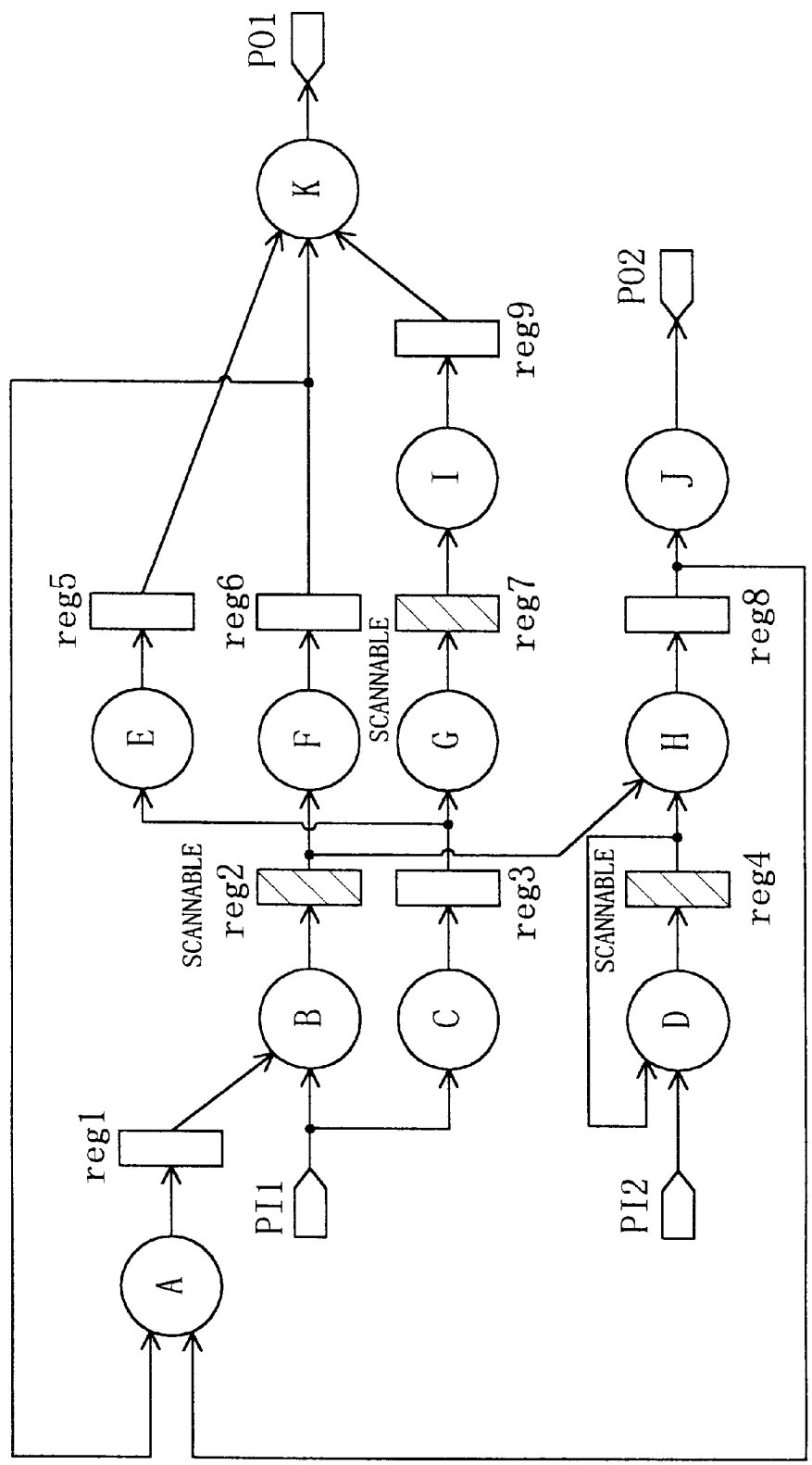
FIG. 6 is a directed graph for showing selection of scannable registers in the RTL circuit of FIG. 3 in the case where a structure having combinational test pattern generation complexity (i.e., a balanced structure) is specified as the easily testable circuit structure.

FIG. 6 is a directed graph for showing selection of scannable registers in step S13 in the RTL circuit of FIG. 3 in the case where the structure with combinational test pattern generation complexity (a balanced structure) is specified as the easily testable circuit structure in step S11. In FIG. 6, there is more than one sort of the number of registers in paths between the primary input PI1 and the primary output PO1, and there is more than one sort of the number of registers in paths between the primary input PI2 and the primary output PO2. Also, there is more than one sort of the number of registers in paths between the primary input PI2 and the primary output PO1. Therefore, the circuit can attain the balanced structure by replacing the registers reg2, reg4 and reg7 with scan registers. Accordingly, as is shown in FIG. 6, the hatched registers reg2, reg4 and reg7 are selected as the scannable registers.

In this manner, the scannable registers are selected so that the RTL circuit has the easily testable circuit structure, such as the acyclic structure, the n-fold line-up structure and the structure with combinational test pattern generation complexity, in assuming a normal data input of a scannable register as a pseudo-primary output and a data output thereof as a pseudo-primary input. Accordingly, high fault coverage can be guaranteed in upper stage of design. Furthermore, since the scannable registers are already selected in performing the logic synthesis, an operation timing of a gate level circuit generated through the logic synthesis cannot be affected by the scan design performed thereafter. Thus, re-design can be largely avoided.

(Embodiment 2)

Figure 7:
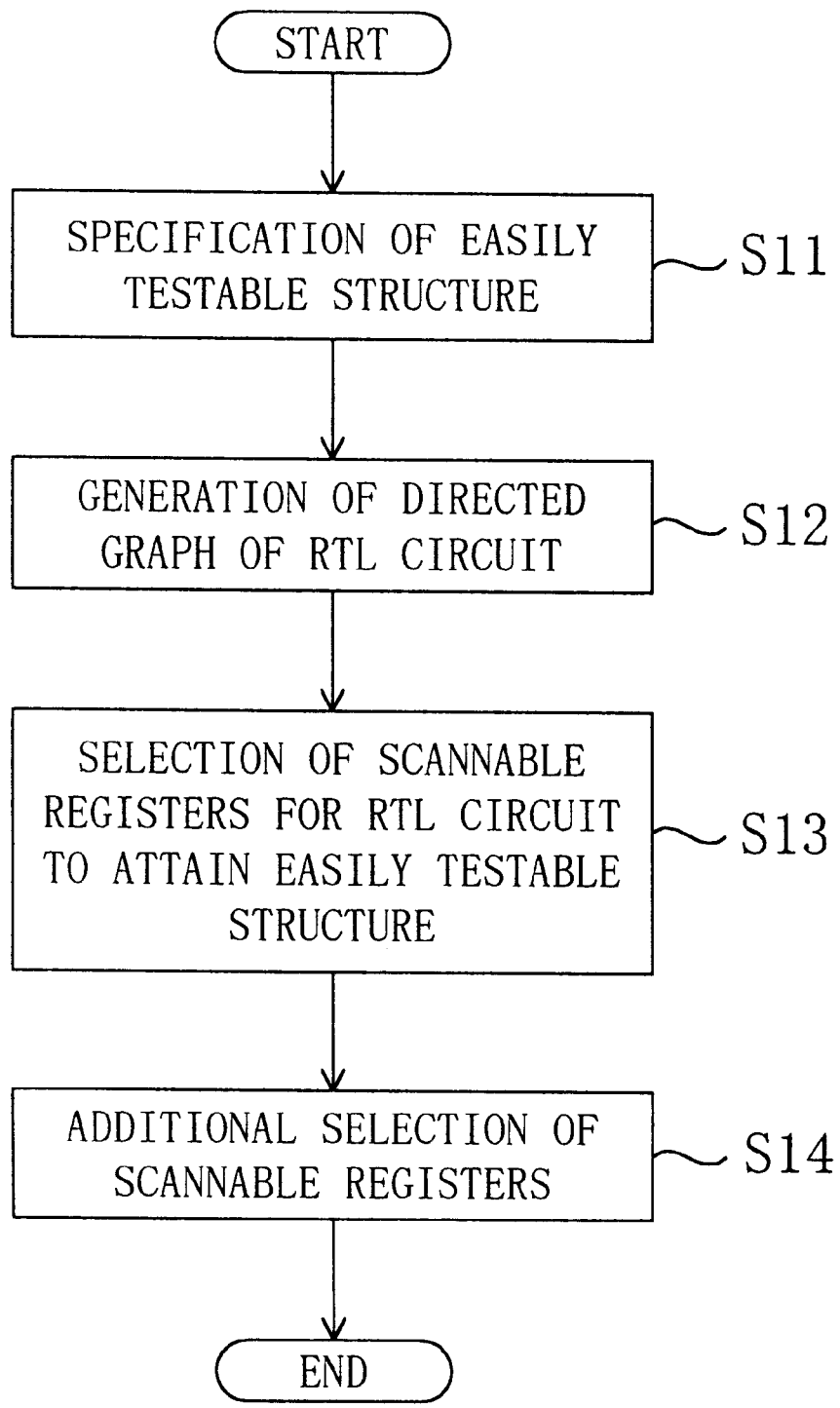
FIG. 7 is a flowchart for showing procedures in a method of design for testability according to a second embodiment of the invention.

FIG. 7 is a flowchart for showing procedures in a method of design for testability according to a second embodiment of the invention. The method of design for testability of this embodiment shown in FIG. 7 includes, in addition to the procedures of the method of design for testability of the first embodiment shown in FIG. 1, step S14 of additionally selecting scannable registers.

In step S14, in the RTL circuit in which the scannable registers are selected in step S13, scannable registers are additionally selected so that each path between one pseudo-primary input and primary outputs or pseudo-primary outputs contains the same number of registers in assuming a normal data input of a scannable register as a pseudo-primary output and a data output thereof as a pseudo-primary input.

Figure 8:
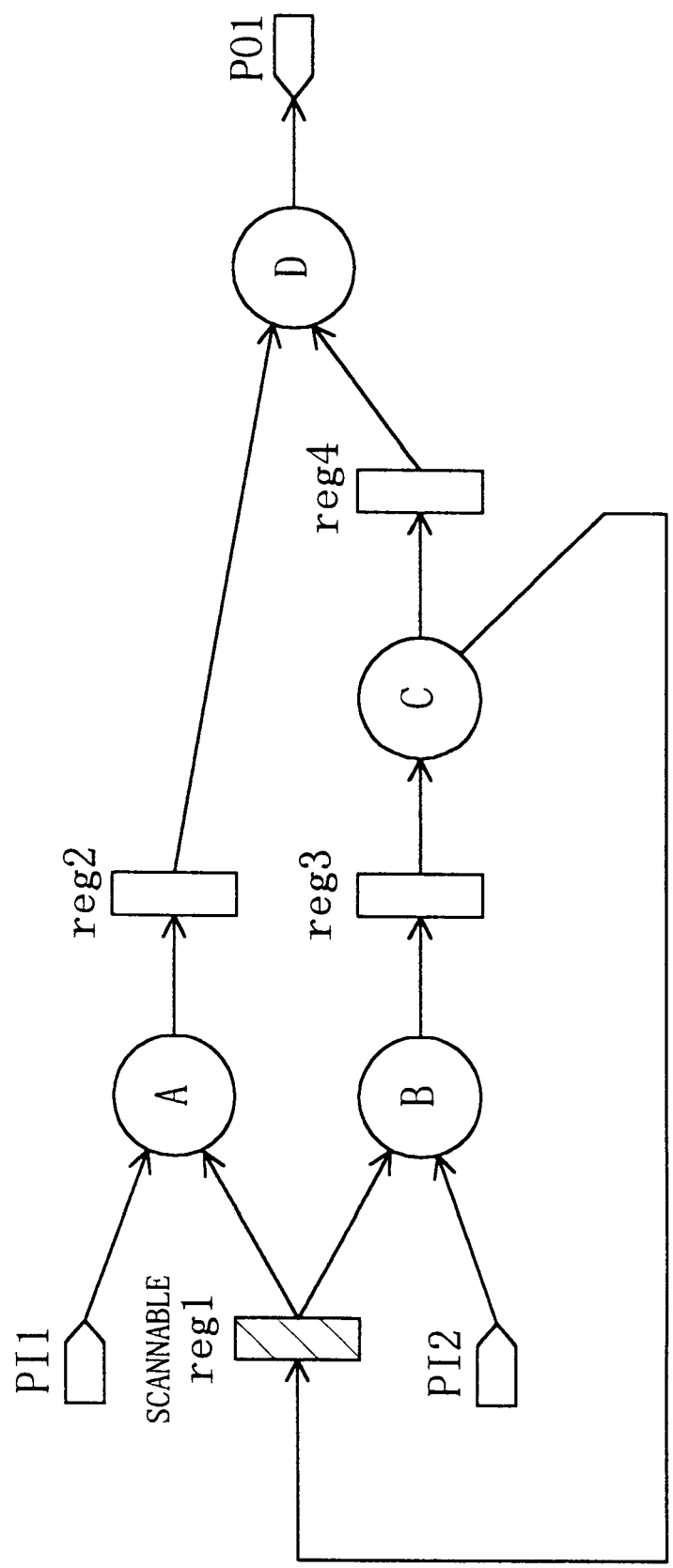
FIG. 8 is a directed graph for showing an example of an RTL circuit applicable to the method of design for testability of the second embodiment.

FIG. 8 is a directed graph for showing an example of an RTL circuit applicable to the method of design for testability of this embodiment, generated on the basis of RTL design data in step S12. In FIG. 8, A through D indicate combinational facilities, reg1 through reg4 indicate registers, PI1 and PI2 indicate primary inputs and PO1 indicates a primary output. In the directed graph of FIG. 8, the acyclic structure is assumed to be specified as the easily testable circuit structure in step S11. Since the original directed graph includes a loop consisting of the registers reg1 and reg3 and the combinational facilities B and C, the hatched register reg1 is selected as the scannable register so as to break this loop.

Figure 9:
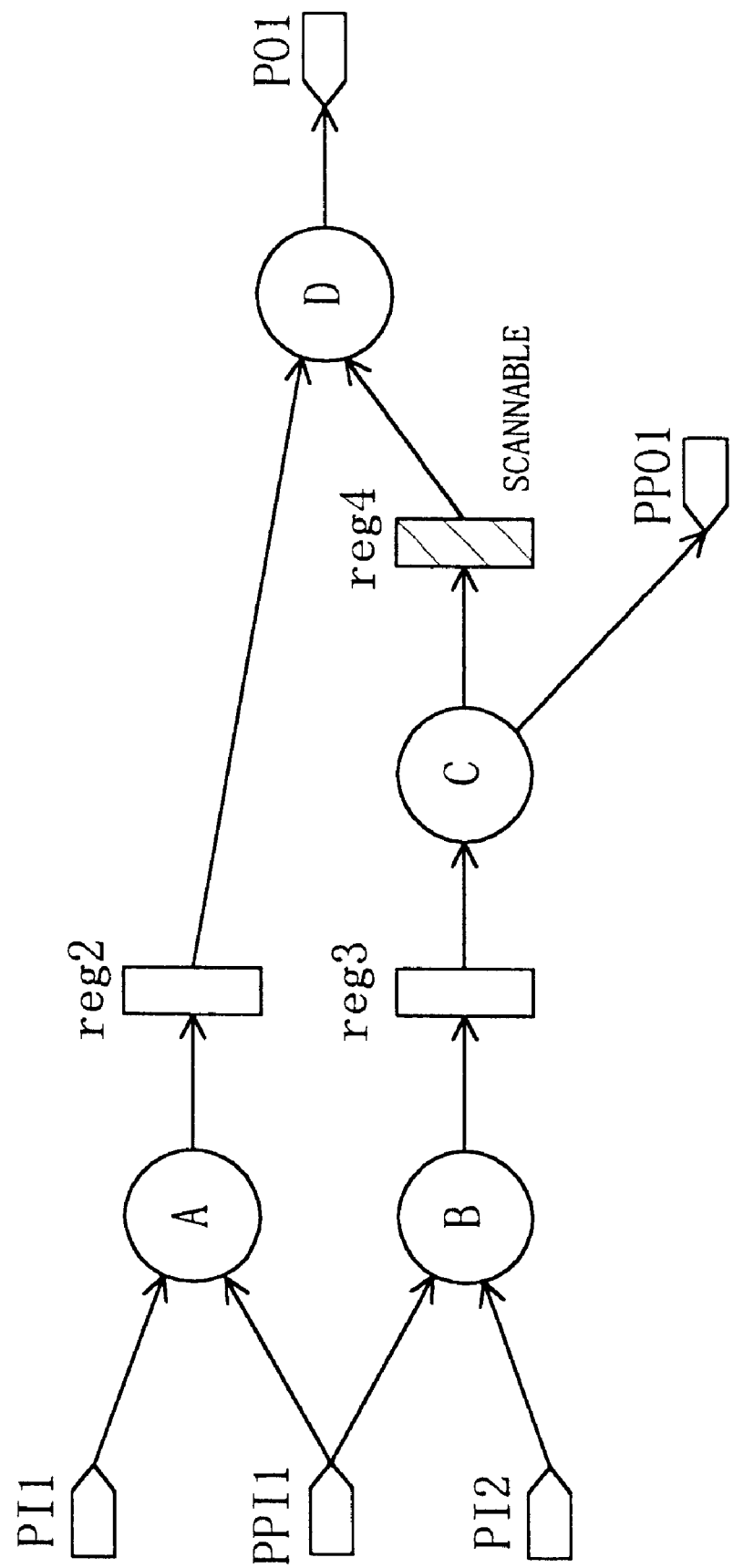
FIG. 9 is a directed graph obtained from the RTL circuit of FIG. 8 in assuming a normal data input of a scannable register as a pseudo-primary output and a data output thereof as a pseudo-primary input.

FIG. 9 is a directed graph obtained by assuming the normal data input of the register reg1, which is selected as the scannable register in the RTL circuit of FIG. 8, as a pseudo-primary output PPO1 and the data output thereof as a pseudo-primary input PPI1. In FIG. 9, paths between the pseudo-primary input PPI1 and the primary input PO1 contain two sorts of the number of registers (namely, one register and two registers). Therefore, the hatched register reg4 is additionally selected as the scannable register in step S14, so that each path contains the same number of registers.

In this manner, when the scannable registers are additionally selected so that each path from one pseudo-primary input to primary outputs or pseudo-primary outputs contains the same number of registers in assuming a normal data input of a scannable register as a pseudo-primary output and a data output thereof as a pseudo-primary input, a shift operation can be limited in scanning test sequences for a given fault. As a result, the number of test sequences can be reduced.

(Embodiment 3)

In a third embodiment of the invention, a method of test sequence generation for a sequential circuit will be described. The method of test sequence generation of this embodiment is applicable to an RTL circuit in which scannable registers are selected by the method of design for testability of the first or second embodiment. Furthermore, the method of test sequence generation of this embodiment is applicable also to an RTL circuit initially having the acyclic structure in test and an RTL circuit in which scannable registers are selected and the acyclic structure is attained in assuming a normal data input of the scannable register as a pseudo-primary output and a data output thereof as a pseudo-primary input in test.

Figure 10:
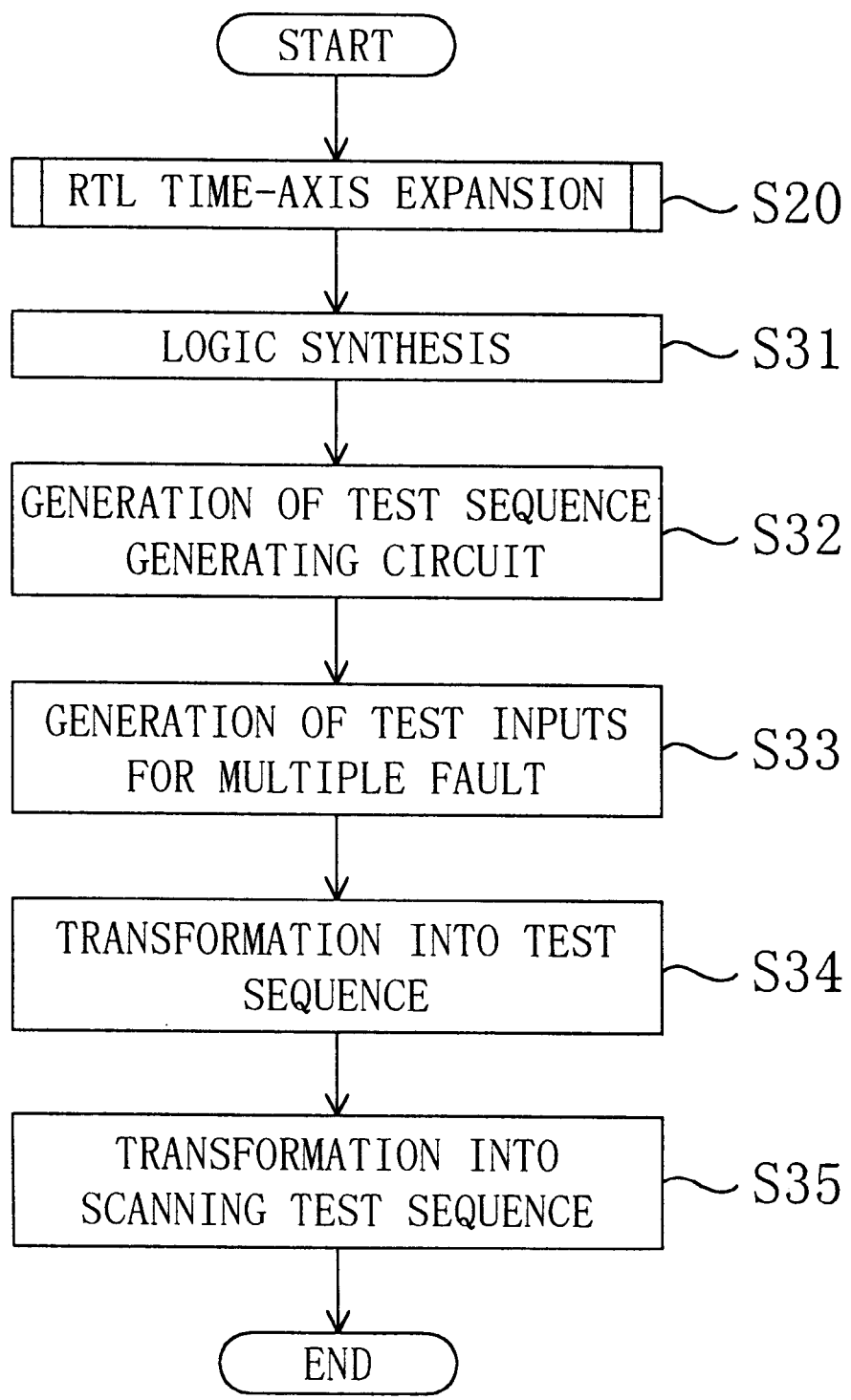
FIG. 10 is a flowchart for showing procedures in a method of test sequence generation according to a third embodiment of the invention.

FIG. 10 is a flowchart for showing procedures in the method of test sequence generation of the third embodiment. In FIG. 10, in step S20, an applied RTL circuit is timeframe expanded, so as to generate a timeframe expanded RTL circuit, and data of timeframes including each of primary outputs and pseudo-primary outputs are stored; in step S31, the RTL circuit is logically synthesized to generate a gate level circuit; in step S32, the gate level circuit is timeframe expanded on the basis of data of the timeframes including each of primary outputs and pseudo-primary outputs stored in step S20, so as to generate a timeframe expanded gate level circuit, namely, a timeframe expanded combinational circuit, as a test sequence generating circuit, and data of timeframes including each of primary inputs and pseudo-primary inputs are stored; in step S33, test patterns for a combinational circuit for detecting multiple stuck-at faults are generated with regard to the timeframe expanded combinational circuit generated in step S32; in step S34, the test patterns generated in step S33 are transformed into test sequences for a sequential circuit on the basis of data of the timeframes including the primary inputs and pseudo-primary inputs stored in step S32; and in step S35, the test sequences transformed in step S34 are transformed into scanning test sequences in view of a scan shift operation.

First, procedures in step S20 will be described with reference to FIGS. 11 through 20.

Figure 11:
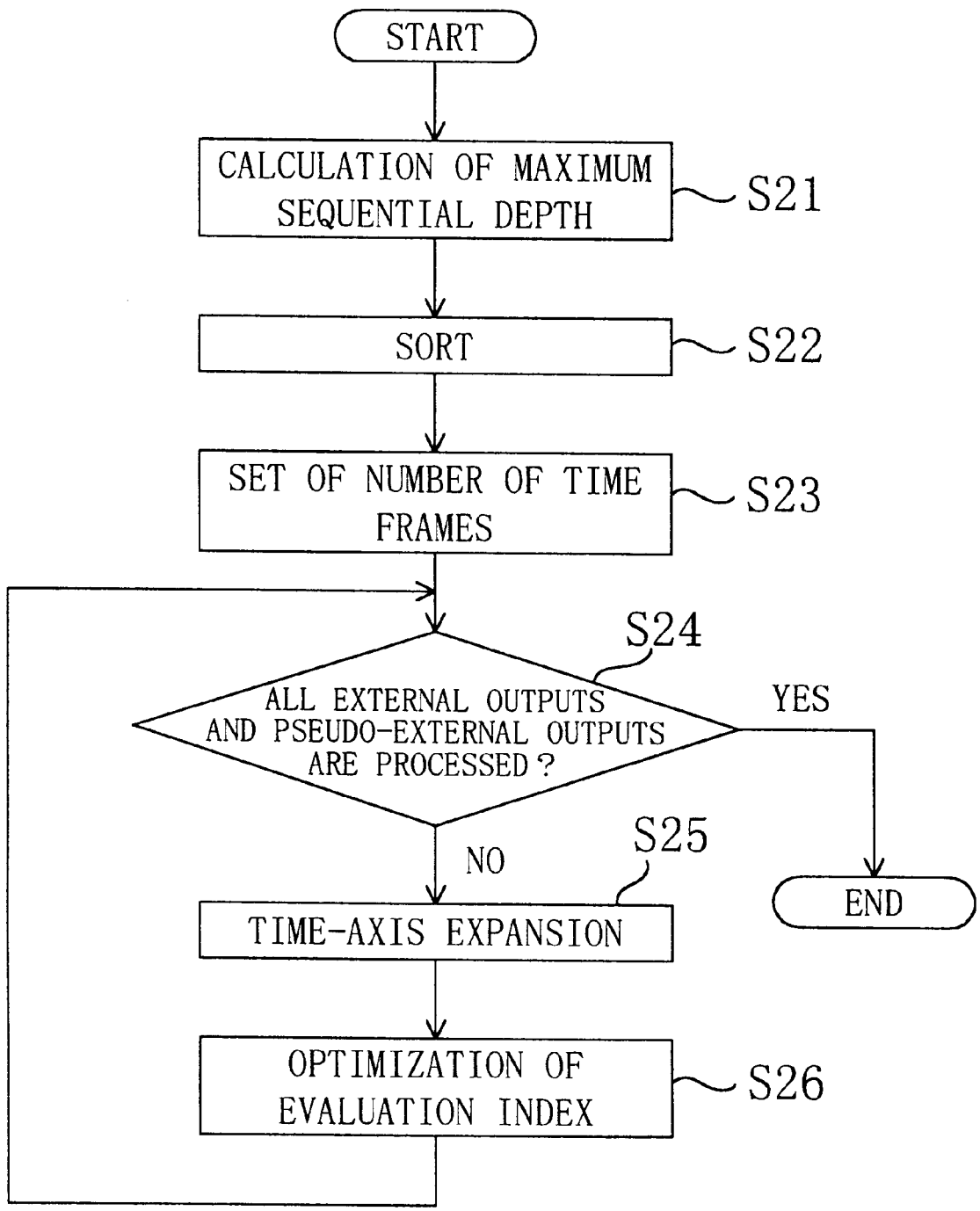
FIG. 11 is a flowchart for showing detailed procedures of an RTL timeframe expanding step S20 in the method of test sequence generation of the third embodiment of FIG. 10.

FIG. 11 is a flowchart for showing detailed procedures of step S20 in the method of test sequence generation of this embodiment. In the flowchart of FIG. 11, in step S21, about each of primary outputs and pseudo-primary outputs, the maximum value of sequential depths to primary inputs or pseudo-primary inputs, namely, a maximum sequential depth, is obtained; in step S22, the primary outputs and pseudo-primary outputs are sorted in the descending order of their maximum sequential depths; in step S23, the number of timeframes in the timeframe expansion is set; and in steps S24 through S26, the timeframe expansion is conducted about each of the primary outputs and pseudo-primary outputs in the sorted order obtained in step S22 on the basis of a predetermined evaluation function.

Figure 12:
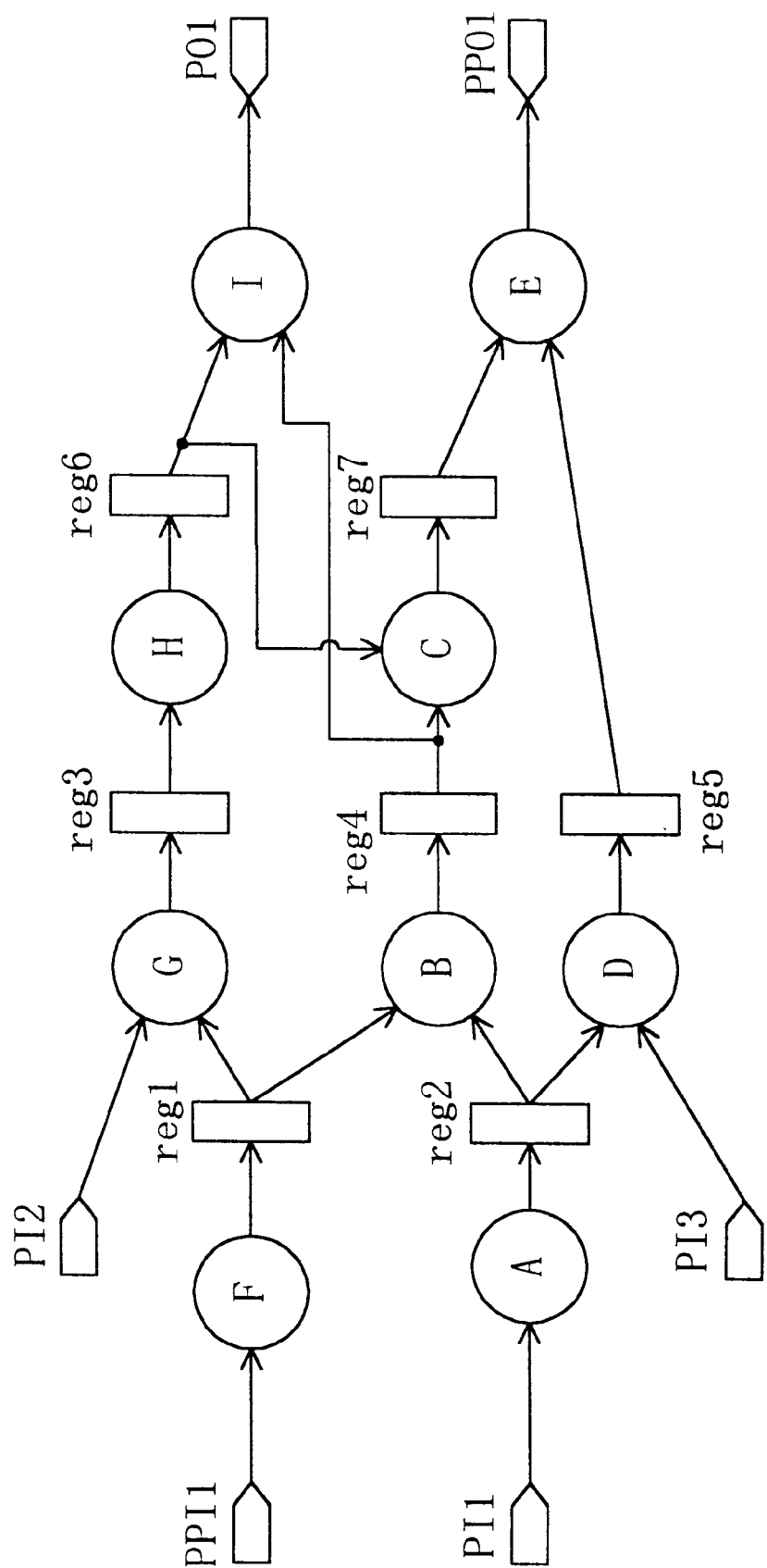
FIG. 12 is a directed graph for showing an example of an RTL circuit applicable to the method of test sequence generation of the third embodiment.

FIG. 12 is a directed graph for showing an example of an RTL circuit applicable to the method of test sequence generation of this embodiment. In FIG. 12, A through I indicate combinational facilities, reg1 through reg7 indicate registers, PI1 through PI3 indicate primary inputs, PPI1 indicates a pseudo-primary input, PO1 indicates a primary output and PPO1 indicates a pseudo-primary output.

First, in step S21, the maximum sequential depths of the primary output PO1 and the pseudo-primary output PPO1 are obtained. With regard to the primary output PO1, a sequential depth to the primary input PI1 is 2, a sequential depth to the primary input PI2 is 2 and a sequential depth to the pseudo-primary input PPI1 is 3, and hence, the maximum sequential depth of the primary output PO1 is 3. Also, with regard to the pseudo-primary output PPO1, a sequential depth to the primary input PI1 is 3, a sequential depth to the primary input PI2 is 3 and a sequential depth to the pseudo-primary input PPI1 is 4, and hence, the maximum sequential depth of the pseudo-primary output PPO1 is 4.

Next, in step S22, the primary output PO1 and the pseudo-primary output PPO1 are sorted in the descending order of their maximum sequential depths. As a result, they are sorted in the order of the pseudo-primary output PPO1 and the primary output PO1.

Then, in step S23, the number of timeframes in the timeframe expansion is set. The number of timeframes required for the timeframe expansion is given by adding 1 to the maximum value of the maximum sequential depths of each of primary outputs and pseudo-primary outputs. Therefore, a value obtained by adding 1 to the maximum sequential depth of the pseudo-primary output PPO1 which is sorted in the lead, namely, 5 is set as the number of timeframes.

Thereafter, the RTL circuit is timeframe expanded in steps S24 through S26. The timeframe expansion in this embodiment is conducted about each of the primary or pseudo-primary outputs in the sorted order obtained in step S22. Specifically, the timeframe expansion is conducted first about the pseudo-primary output PPO1, and then about the primary output PO1. In the timeframe expansion, it is determined on the basis of a predetermined evaluation function which timeframe includes the primary or pseudo-primary output.

In this embodiment, the total number of combinational facilities included in each timeframe is used as the evaluation function, and the timeframe expansion is conducted so as to make this evaluation function as small as possible. The number of gates of a test sequence generating circuit is substantially in proportion to the total number of combinational facilities included in each timeframe, and test sequences can be generated more easily when the number of gates of the test sequence generating circuit is smaller. Therefore, when the total number of combinational facilities included in each timeframe is used as the evaluation function for the timeframe expansion, test sequences can be more easily generated.

Figure 13:
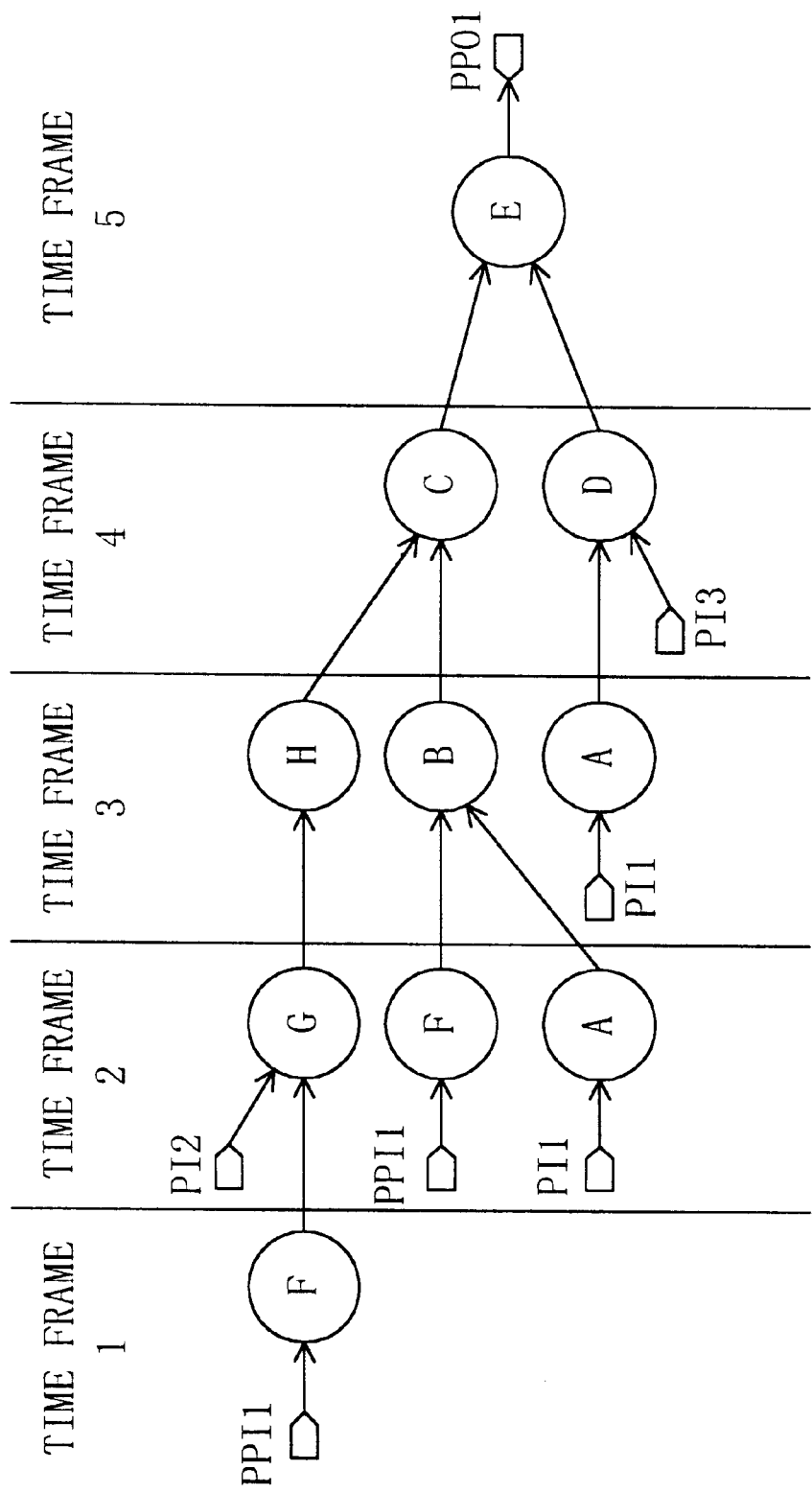
FIG. 13 is a diagram resulting from timeframe expansion with respect to a pseudo-primary output PPO1 in the RTL circuit of FIG. 12.

FIG. 13 is a diagram for showing a result of the timeframe expansion with respect to the pseudo-primary output PPO1. Since the maximum sequential depth of the pseudo-primary output PPO1 is 4, the number of timeframes required for the timeframe expansion is 5, which is equal to the number of timeframes set in step S23. Therefore, the pseudo-primary output PPO1 is inevitably determined to be disposed in a timeframe 5.

Next, the timeframe expansion is conducted about the primary output PO1. Since the maximum sequential depth of the primary output PO1 is 3, the number of timeframes required for the timeframe expansion is 4. Therefore, the primary output PO1 is disposed in a timeframe 4 or 5, and it is determined whether the primary output PO1 is disposed in the timeframe 4 or in the timeframe 5 on the basis of the evaluation function.

Figure 14:
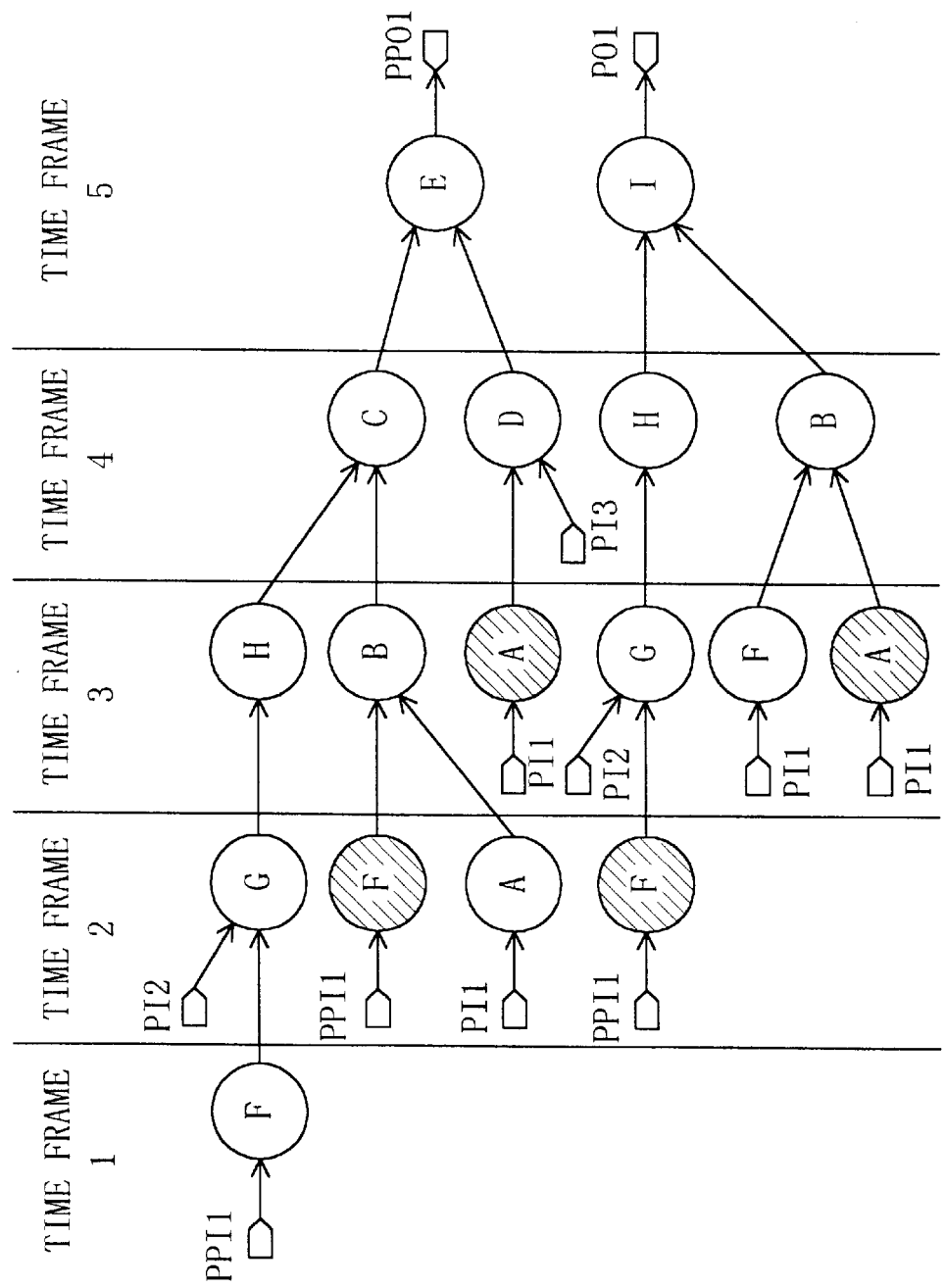
FIG. 14 is a diagram resulting from the timeframe expansion with a primary output PO1 disposed in a timeframe 5 in addition to the timeframe expansion of FIG. 13.

FIG. 14 is a diagram obtained when the primary output PO1 is disposed in the timeframe 5. The number of combinational facilities concerning the timeframe expansion with respect to the pseudo-primary output PPO1 is 10, and the number of combinational facilities concerning the timeframe expansion with respect to the primary output PO1 is 7. Therefore, when none of the combinational facilities appears twice in each timeframe, the total number of combinational facilities included in the timeframes, that is, the value of the aforementioned evaluation function, is 17. In FIG. 14, the combinational facility F appears twice in a timeframe 2, and the combinational facility A appears twice in a timeframe 3, and hence, the number of the combinational facilities appearing twice is 2. Therefore, the value of the evaluation function obtained by disposing the primary output PO1 in the timeframe 5 is 15, which is obtained by subtracting the number of the combinational facilities appearing twice, i.e., 2, from the total number of the combinational facilities included in the timeframes, i.e., 17.

Figure 15:
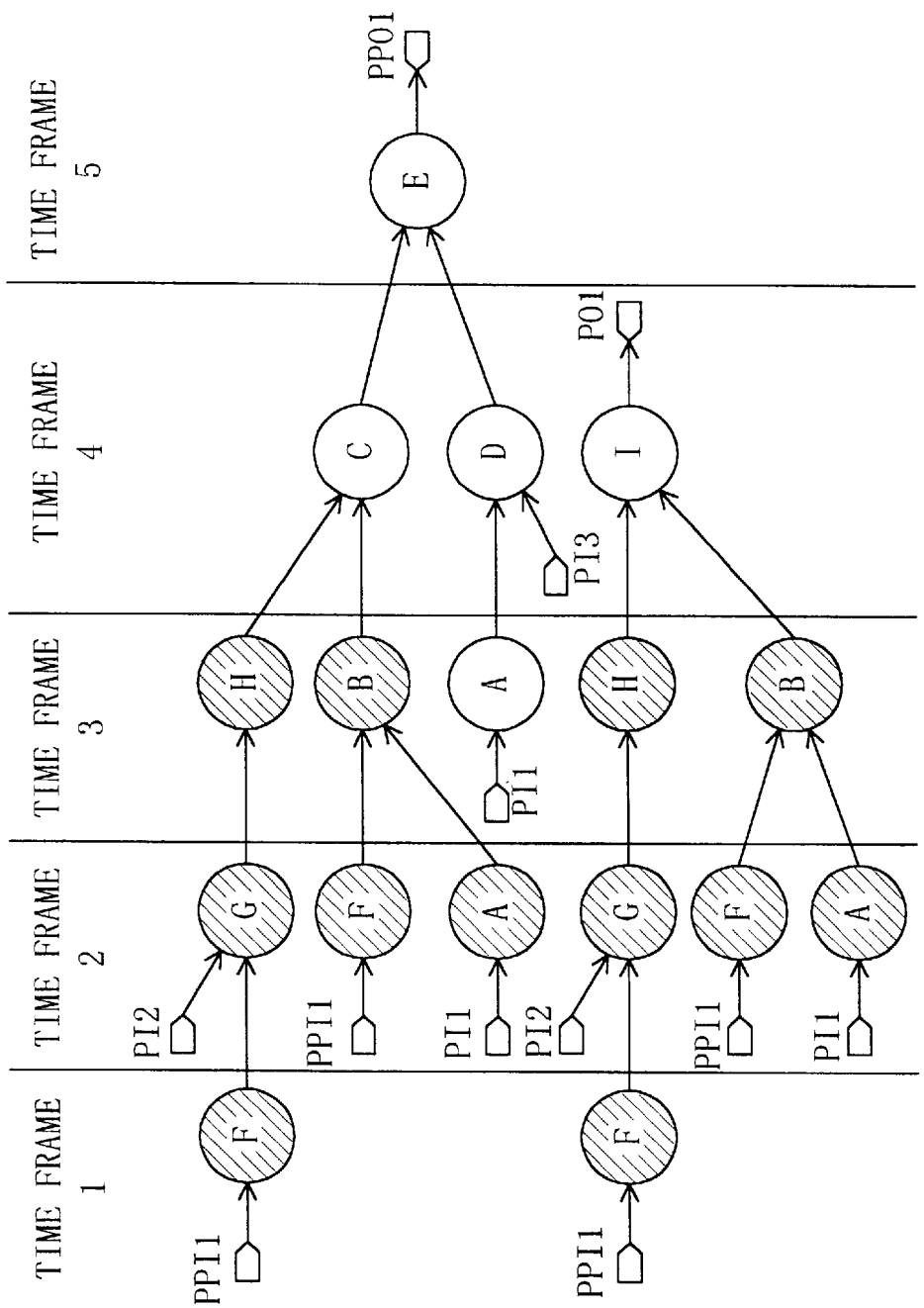
FIG. 15 is a diagram resulting from the timeframe expansion with the primary output PO1 disposed in a timeframe 4 in addition to the timeframe expansion of FIG. 13.

FIG. 15 is a diagram obtained when the primary output PO1 is disposed in the timeframe 4. In FIG. 15, the combinational facility F appears twice in a timeframe 1, the combinational facilities A, F and G respectively appear twice in the timeframe 2, and the combinational facilities B and H respectively appear twice in the timeframe 3. Therefore, the number of the combinational facilities appearing twice is 6. Accordingly, the value of the evaluation function obtained by disposing the primary output PO1 in the timeframe 4 is 11, which is obtained by subtracting the number of the combinational facilities appearing twice, i.e., 6, from the total number of the combinational facilities included in the timeframes, i.e., 17.

Figure 16:
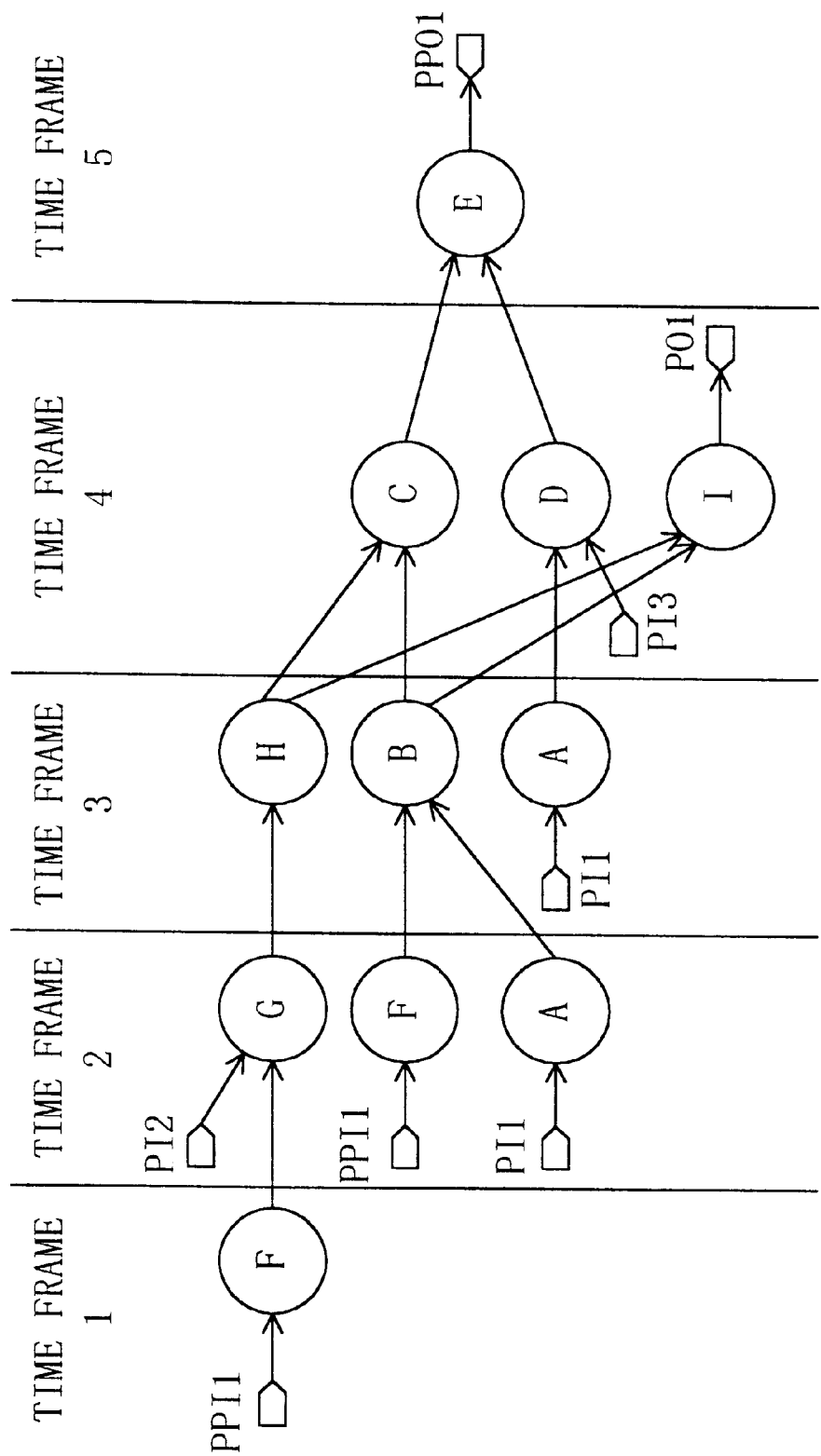
FIG. 16 is a diagram resulting from the timeframe expansion of the RTL circuit of FIG. 12.

As a result, the primary output PO1 is determined to be disposed in the timeframe 4. In this manner, the timeframe expansion of the RTL circuit of FIG. 12 results in a timeframe expanded RTL circuit as is shown in FIG. 16. In step S20, the position of the pseudo-primary output PPO1 is stored as the timeframe 5, and the position of the primary output PO1 is stored as the timeframe 4.

Figure 17:
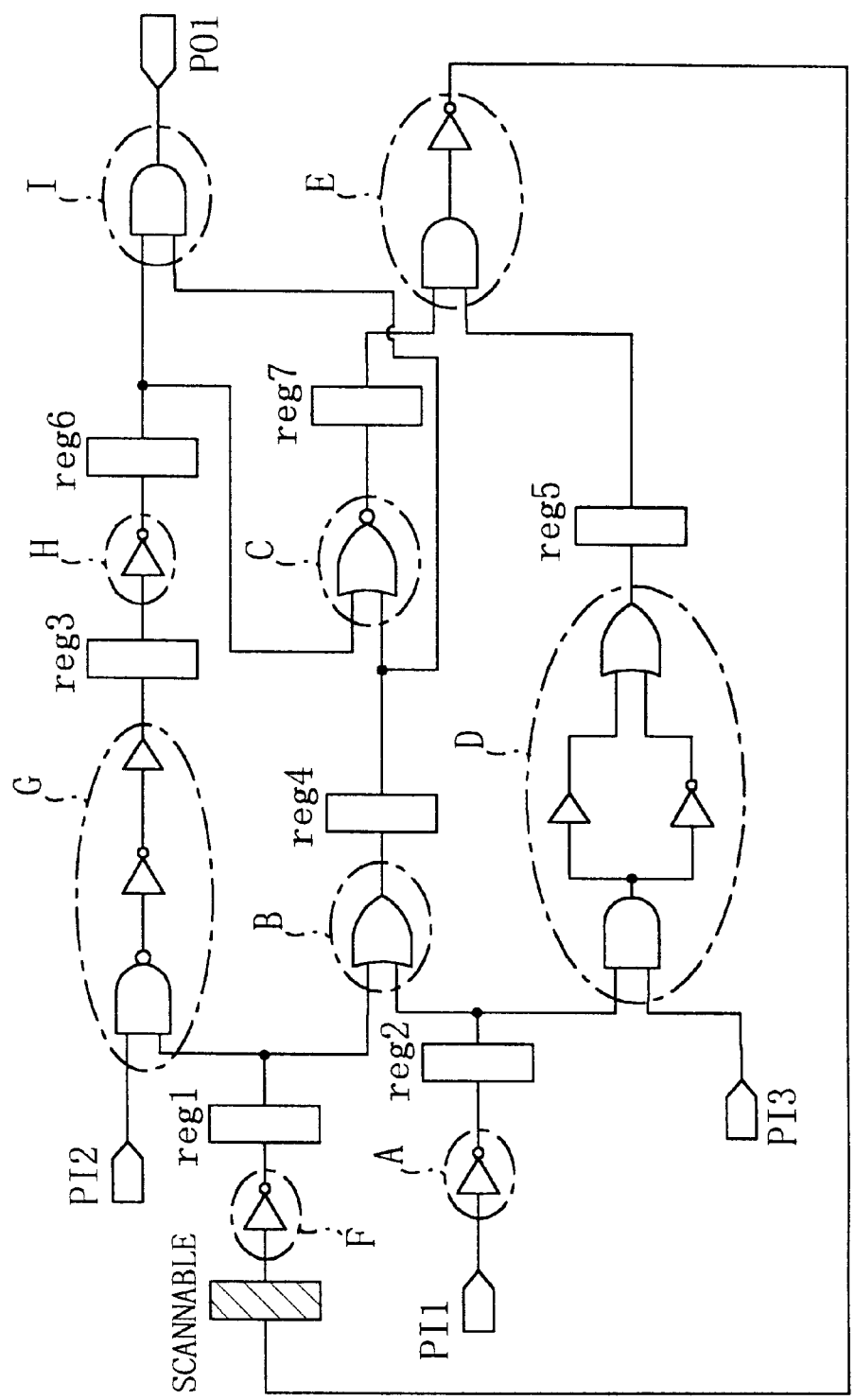
FIG. 17 is a directed graph of a gate level circuit generated through logic synthesis of the RTL circuit of FIG. 12.

Next, in step S31, the gate level circuit is generated through logic synthesis of the RTL circuit. FIG. 17 is a directed graph of the gate level circuit generated through the logic synthesis of the RTL circuit of FIG. 12.

Figure 18:
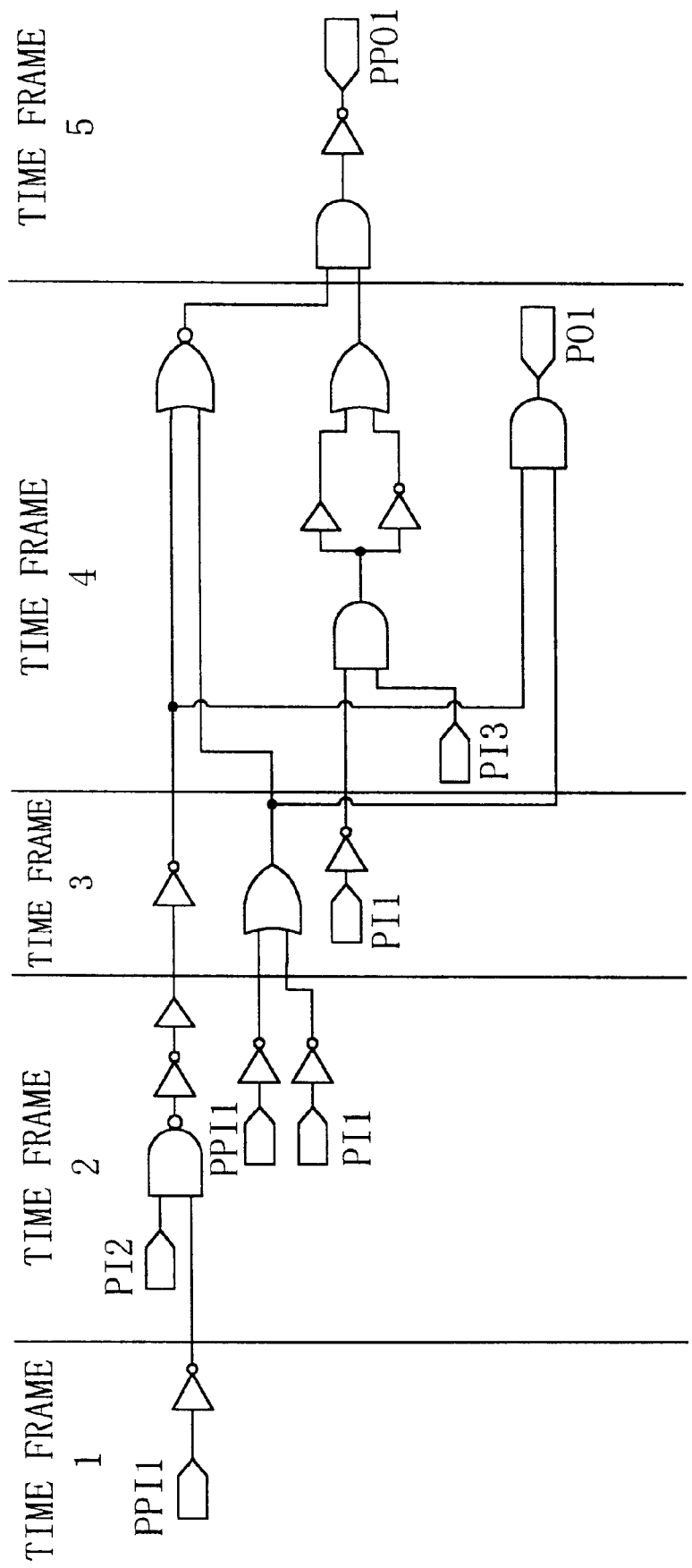
FIG. 18 is a diagram of a timeframe expanded combinational circuit generated from the RTL circuit of FIG. 12 on the basis of the timeframe expanded RTL circuit of FIG. 16 and the gate level circuit of FIG. 17.

Then, in step S32, on the basis of the timeframe expanded RTL circuit obtained In step S20 and the gate level circuit generated in step S31, the timeframe expanded gate level circuit for test sequence generation (i.e., the timeframe expanded combinational circuit) is generated. Specifically, each of the primary outputs and pseudo-primary outputs of the applied RTL circuit is disposed in the timeframes stored in step S20, and the timeframe expansion is conducted at gate level about the thus disposed primary outputs and pseudo-primary outputs on the basis of data of the gate level circuit generated in step S31, thereby generating the timeframe expanded combinational circuit. FIG. 18 is a diagram of the timeframe expanded combinational circuit generated in step S32 on the basis of the timeframe expanded RTL circuit of FIG. 16 and the gate level circuit of FIG. 17.

Next, in step S33, with regard to the timeframe expanded combinational circuit generated in step S32, multiple test patterns for a combinational circuit are generated. For example, with regard to the timeframe expanded combinational circuit of FIG. 18, the following test patterns for detecting a fault are generated:

$PI1(2)=0, PI1(3)=1, PI2(2)=0, PI3(4)=1$ $PPI1(1)=0, PPI1(2)=1$ wherein each numeral in parentheses corresponds to the number of the timeframe. For example, "PPI1(1)=0" means that a test pattern for the pseudo-primary input PPI1 disposed in the timeframe 1 is "0".

Next, in step S34, the test patterns generated in step S33 are transformed into test sequences for a sequential circuit in accordance with the timeframes including each of primary inputs and pseudo-primary inputs. The test patterns for the timeframe expanded combinational circuit of FIG. 18 are transformed into the following test sequences (X means Don't Care):

$PI1=X01XX, PI2=X0XXX, PI3=XXX1X$ $PPI1=01XXX$

Furthermore, in step S35, the test sequences for the pseudo-primary input are transformed into scanning test sequences in view of a scan path shift operation. With regard to the timeframe expanded combinational circuit of FIG. 18, the test sequence for the pseudo-primary input PPI1 is transformed into a scanning test sequence.

In this manner, by using the total number of the combinational facilities included in each timeframe as the evaluation function, the RTL circuit is timeframe expanded with minimizing the evaluation function, and the timeframe expanded combinational circuit is thus generated. Accordingly, the size of the combinational circuit for test pattern generation can be made smaller, resulting in easily generating the test sequences.

In this embodiment, the total number of the combinational facilities in each timeframe is used as the evaluation function, but a sum of values weighted in accordance with the types of each combinational facility can be used as the evaluation function. Also, the total of the numbers of gates estimated for the combinational facilities in each timeframe can be used as the evaluation function.

Also, in the RTL timeframe expansion in step S20, the timeframe including one primary or pseudo-primary output can be determined without changing the timeframe including another primary or pseudo-primary output already determined with optimizing the evaluation function. Alternatively, the timeframe including another primary or pseudo-primary output already determined can be changed so as to optimize the evaluation function.

The evaluation function used in the RTL timeframe expansion is not limited to the total number of the combinational facilities included in each timeframe.

As another example of the evaluation function, the number of timeframes including a pseudo-primary input or a pseudo-primary output can be used as follows: The number of timeframes including a pseudo-primary input or a pseudo-primary output corresponds to the number of times of the shift operation required in test sequences for detecting a given fault. Therefore, when this evaluation function has a smaller value, the number of times of the shift operation is decreased, resulting in decreasing the length of test sequences. Accordingly, when the timeframe expansion is conducted so as to make this evaluation function have a smaller value, the number of the resultant test sequences can be reduced.

Figure 19:
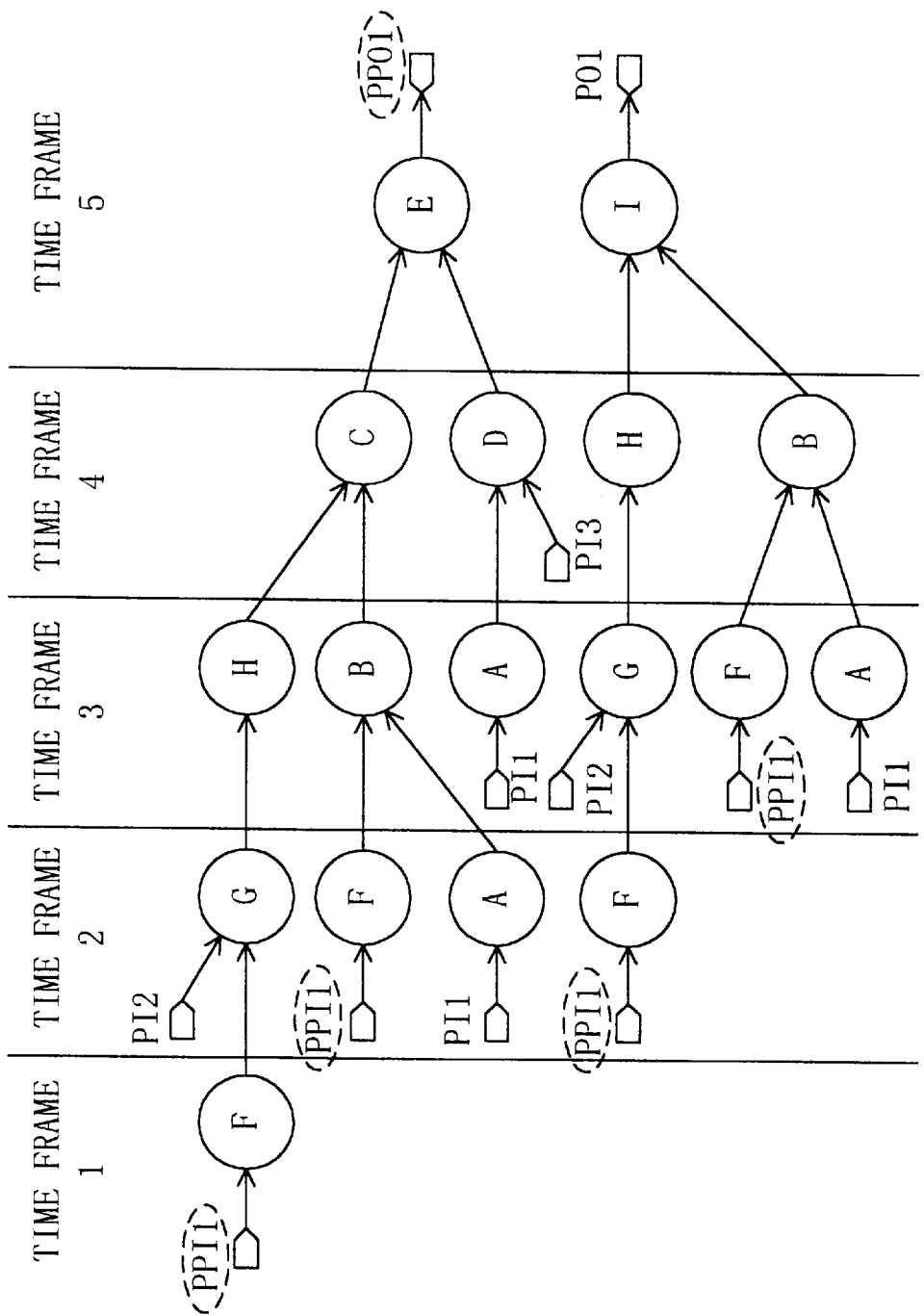
FIG. 19 is a diagram for showing the timeframe expansion of the RTL circuit of FIG. 12 obtained when the primary output PO1 is disposed in a timeframe 5.
Figure 20:
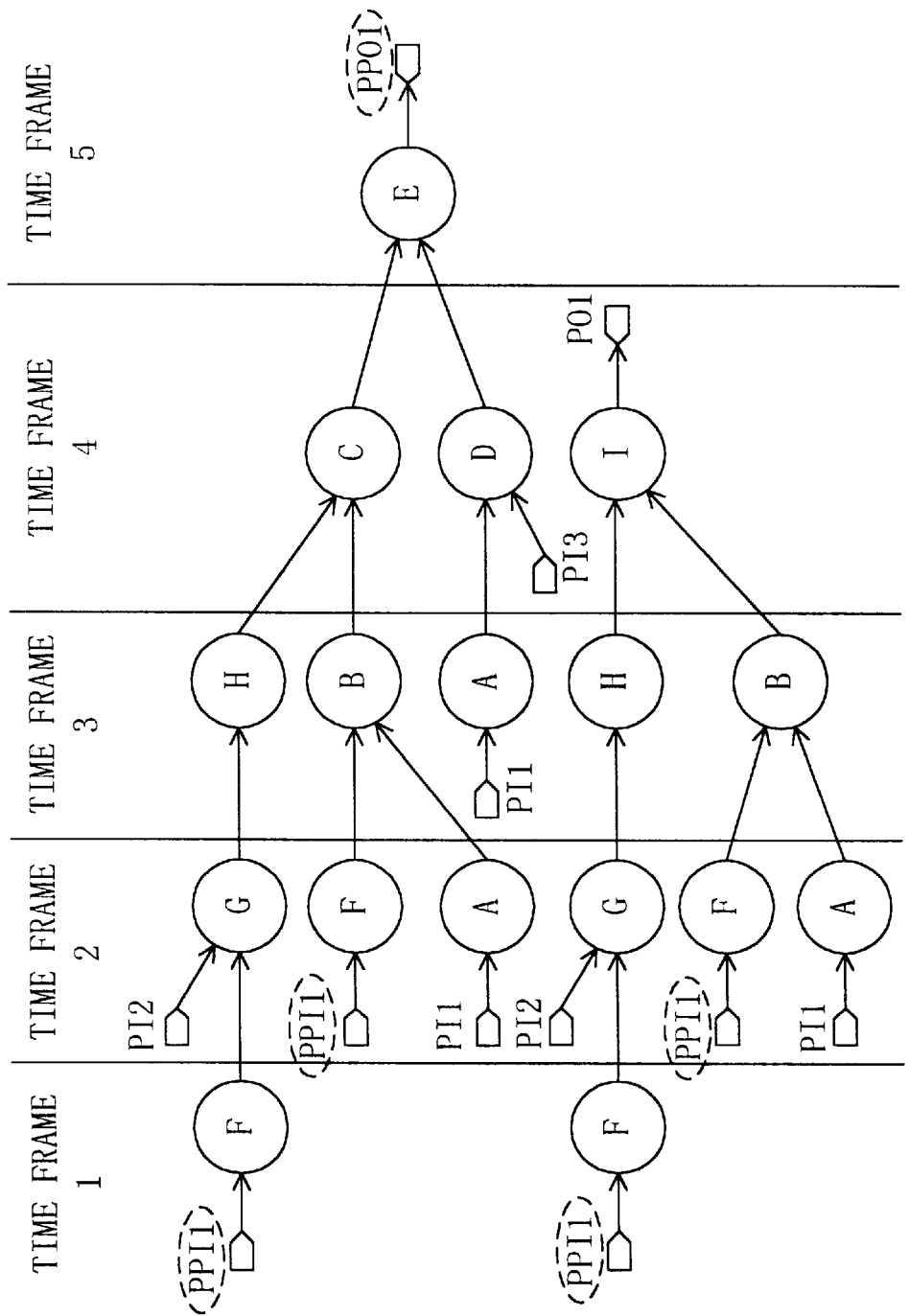
FIG. 20 is another diagram for showing the timeframe expansion of the RTL circuit of FIG. 12 obtained when the primary output PO1 is disposed in a timeframe 4.

FIGS. 19 and 20 are diagrams for showing results of the timeframe expansion of the RTL circuit of FIG. 12, wherein FIG. 19 shows the result obtained by disposing the primary output PO1 in the timeframe 5 and FIG. 20 shows the result obtained by disposing the primary output PO1 in the timeframe 4. As is shown in FIG. 19, when the primary output PO1 is disposed in the timeframe 5, the number of the timeframes including the pseudo-primary input PPI1 or the pseudo-primary output PPO1 is 4 (i.e., the timeframes 1, 2, 3 and 5), and hence, the evaluation function has a value of 4. On the other hand, as is shown in FIG. 20, when the primary output PO1 is disposed in the timeframe 4, the number of the timeframes including the pseudo-primary input PPI1 or the pseudo-primary output PPO1 is 3 (i.e., the timeframes 1, 2 and 5), and hence, the evaluation function has a value of 3.

Accordingly, the primary output PO1 is determined to be disposed in the timeframe 4 so as to make the evaluation function smaller. Also in this case, the timeframe expansion of the RTL circuit of FIG. 12 results in as is shown in FIG. 16.

In this manner, by timeframe expanding the RTL circuit on the basis of the predetermined evaluation function, the timeframe expanded combinational circuit for test sequence generation is generated, so that the test sequences can be easily generated or the number of the test sequences can be reduced.

(Embodiment 4)

In a fourth embodiment of the invention, similarly to the third embodiment, description will be give on a method of test sequence generation for an RTL circuit having the acyclic structure in test or an RTL circuit in which scannable registers are determined and the acyclic structure can be attained in test in assuming a normal data input of a scannable register as a pseudo-primary output and a data output thereof as a pseudo-primary input.

Figure 21:
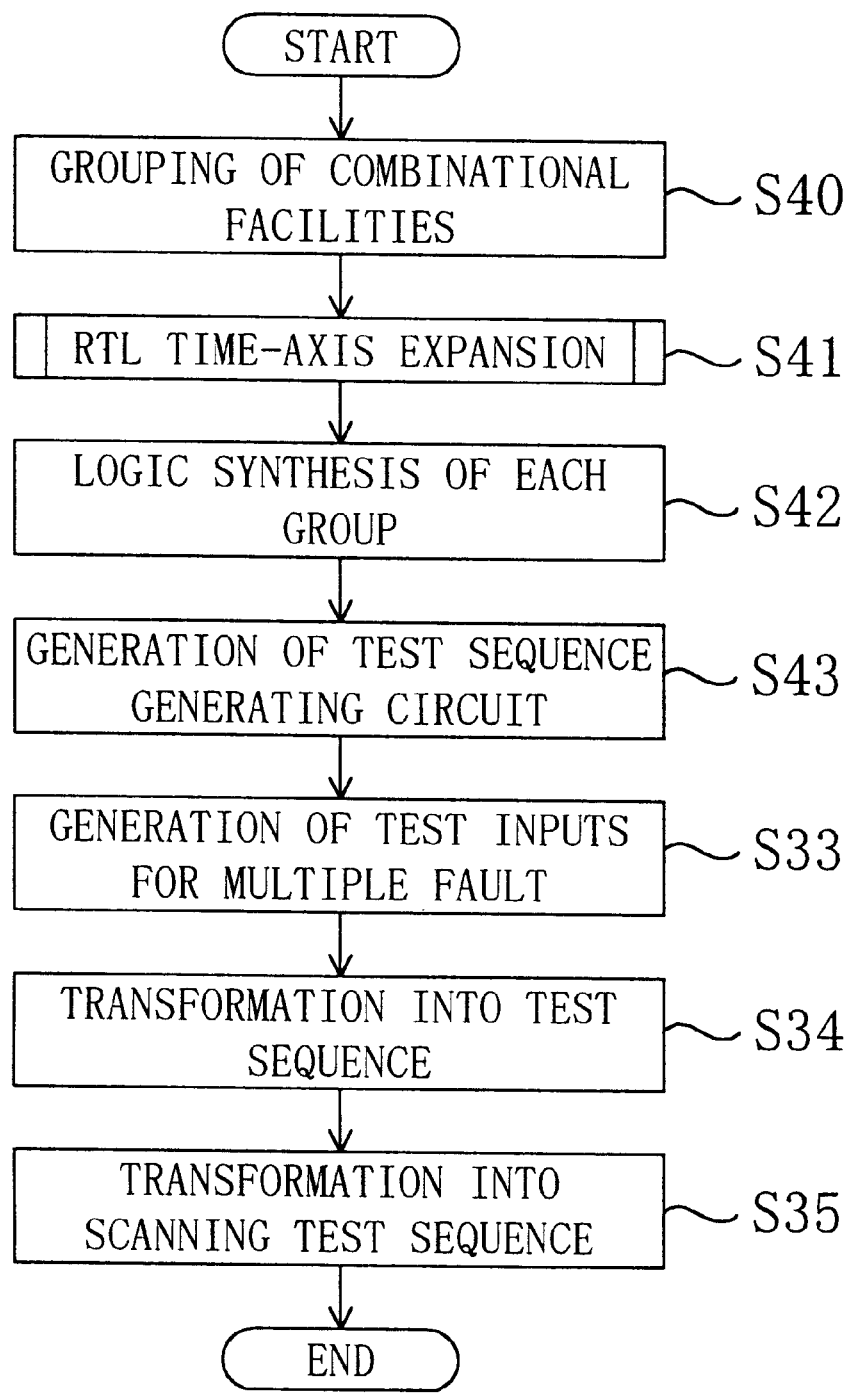
FIG. 21 is a flowchart for showing procedures in a method of test sequence generation according to a fourth embodiment of the invention.

FIG. 21 is a flowchart for showing procedures in the method of test sequence generation of the fourth embodiment. As is shown in FIG. 21, the method of test sequence generation of this embodiment includes the same steps S33 through S35 as the method of test sequence generation of the third embodiment.

In step S40, in an applied RTL circuit, combinational facilities having none of registers, primary inputs and primary outputs on a path therebetween are grouped; in step S41, the RTL circuit is timeframe expanded with the grouped combinational facilities obtained in step S40 regarded as one combinational facility, so as to generate a timeframe expanded RTL circuit; in step S42, logic synthesis is conducted by using the grouped combinational facilities obtained in step S40 as one unit, so as to generated a gate level circuit; and in step S43, a timeframe expanded combinational circuit for test sequence generation is generated on the basis of the timeframe expanded RTL circuit generated in step S40 and the gate level circuit of each group generated in step S42, and timeframes including each of primary inputs and pseudo-primary inputs are stored.

Figure 22:
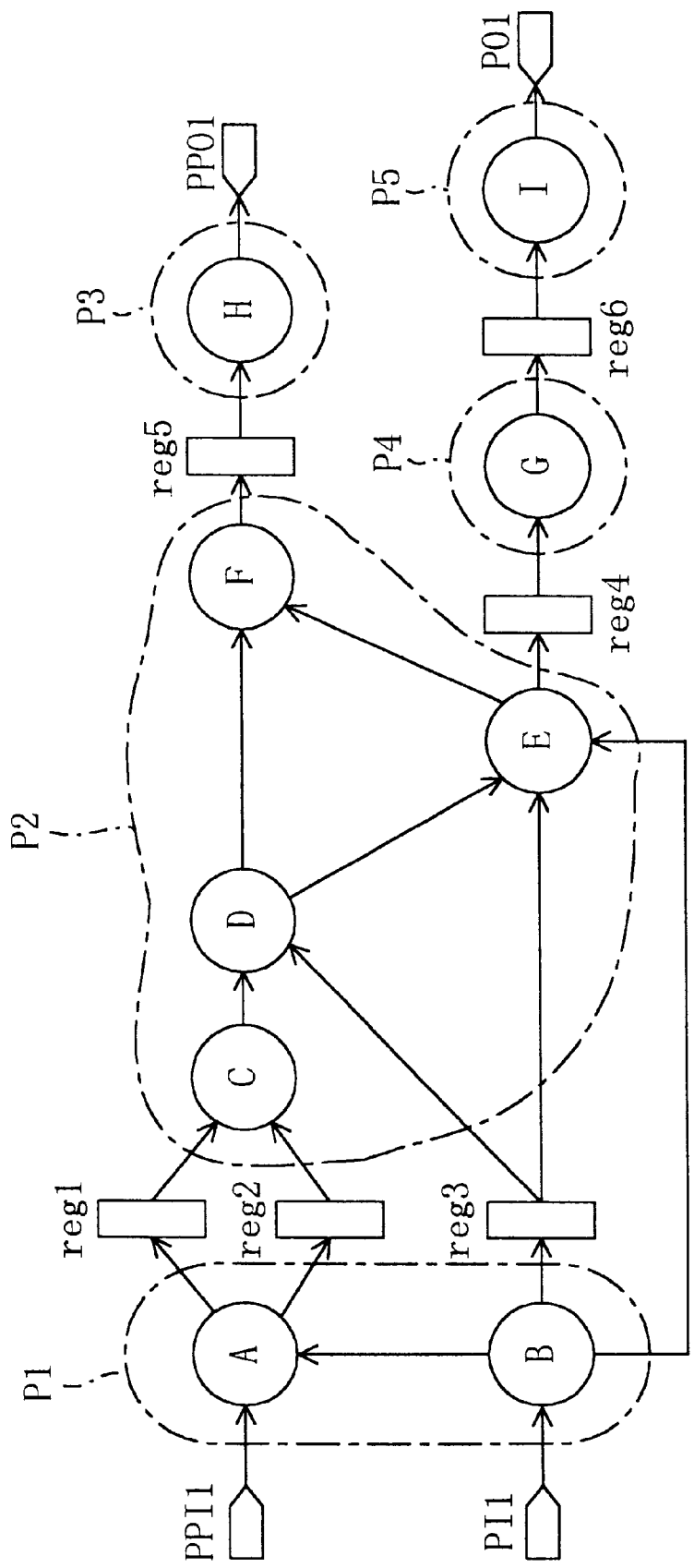
FIG. 22 is a directed graph for showing an example of an RTL circuit applicable to the method of test sequence generation of the fourth embodiment.

FIG. 22 is a directed graph for showing an example of the RTL circuit applicable to the method of test sequence generation of this embodiment. In FIG. 22, A through I indicate combinational facilities, reg1 through reg6 indicate registers, PI1 indicates a primary input, PPI1 indicates a pseudo-primary input, PO1 indicates a primary output and PPO1 indicates a pseudo-primary output.

Figure 23:
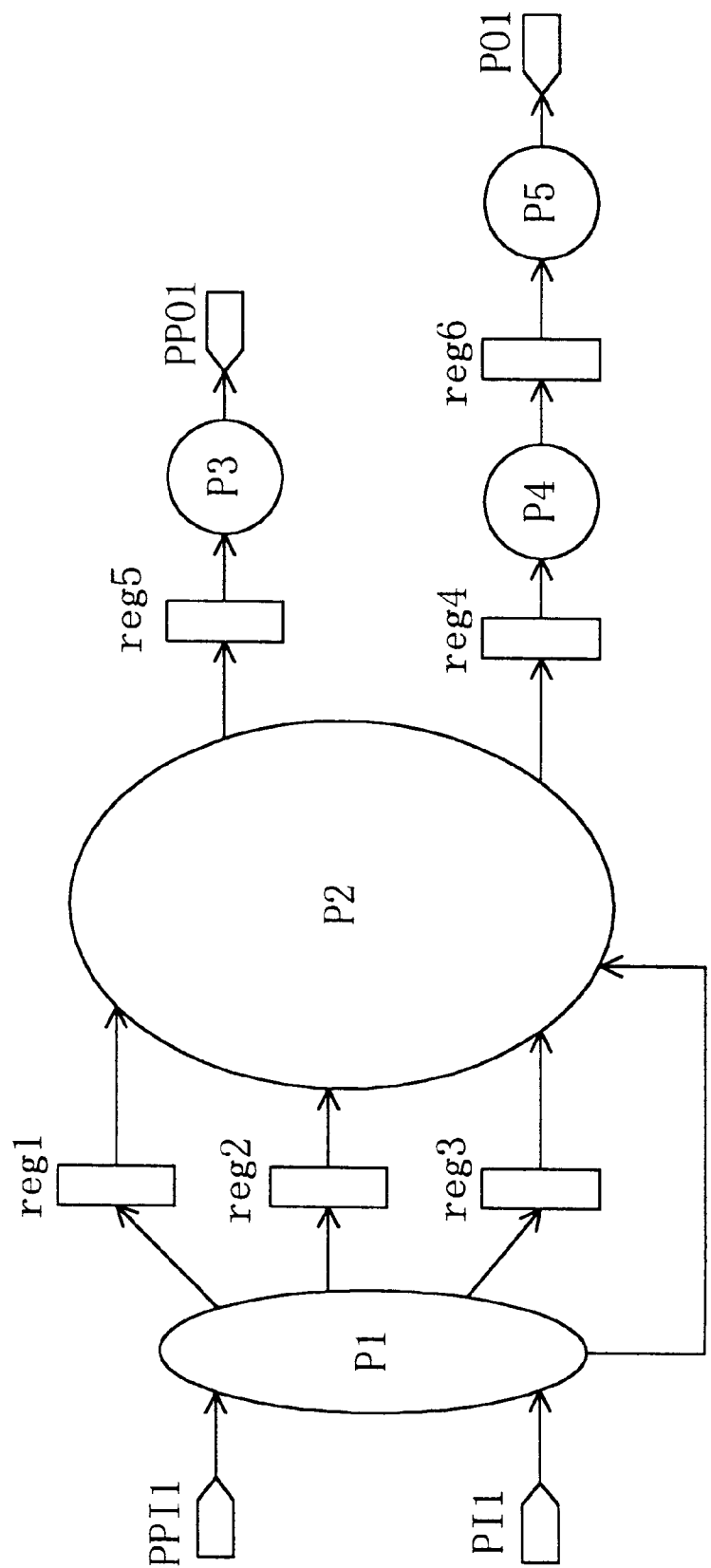
FIG. 23 is a directed graph resulting from grouping of combinational facilities in the RTL circuit of FIG. 22.

First, in step S40, the combinational facilities A through I are divided into groups. In FIG. 22, the combinational facilities A and B together form a group P1, the combinational facilities C, D, E and F together form a group P2, and the combinational facilities H, G and I respectively form groups P3, P4 and P5. FIG. 23 shows the result of the grouping of each combinational facility in step S40.

Figure 24:
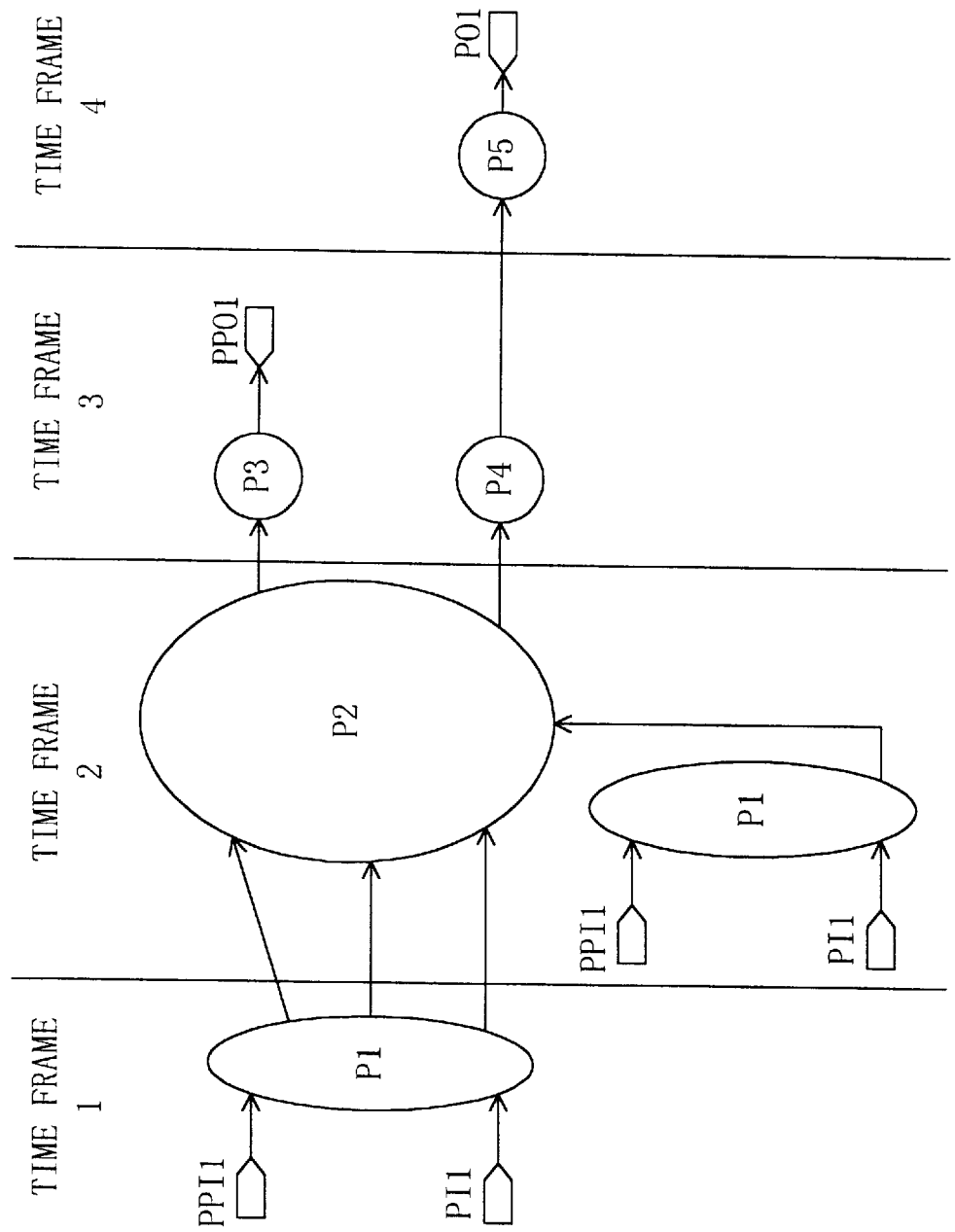
FIG. 24 is a diagram resulting from the timeframe expansion of the RTL circuit of FIG. 23.

Next, in step S41, the RTL circuit of FIG. 23 is timeframe expanded in the same manner as in step S20 of the third embodiment. FIG. 24 is a diagram of the timeframe expanded RTL circuit resulting from the timeframe expansion in step S41.

Figure 25:
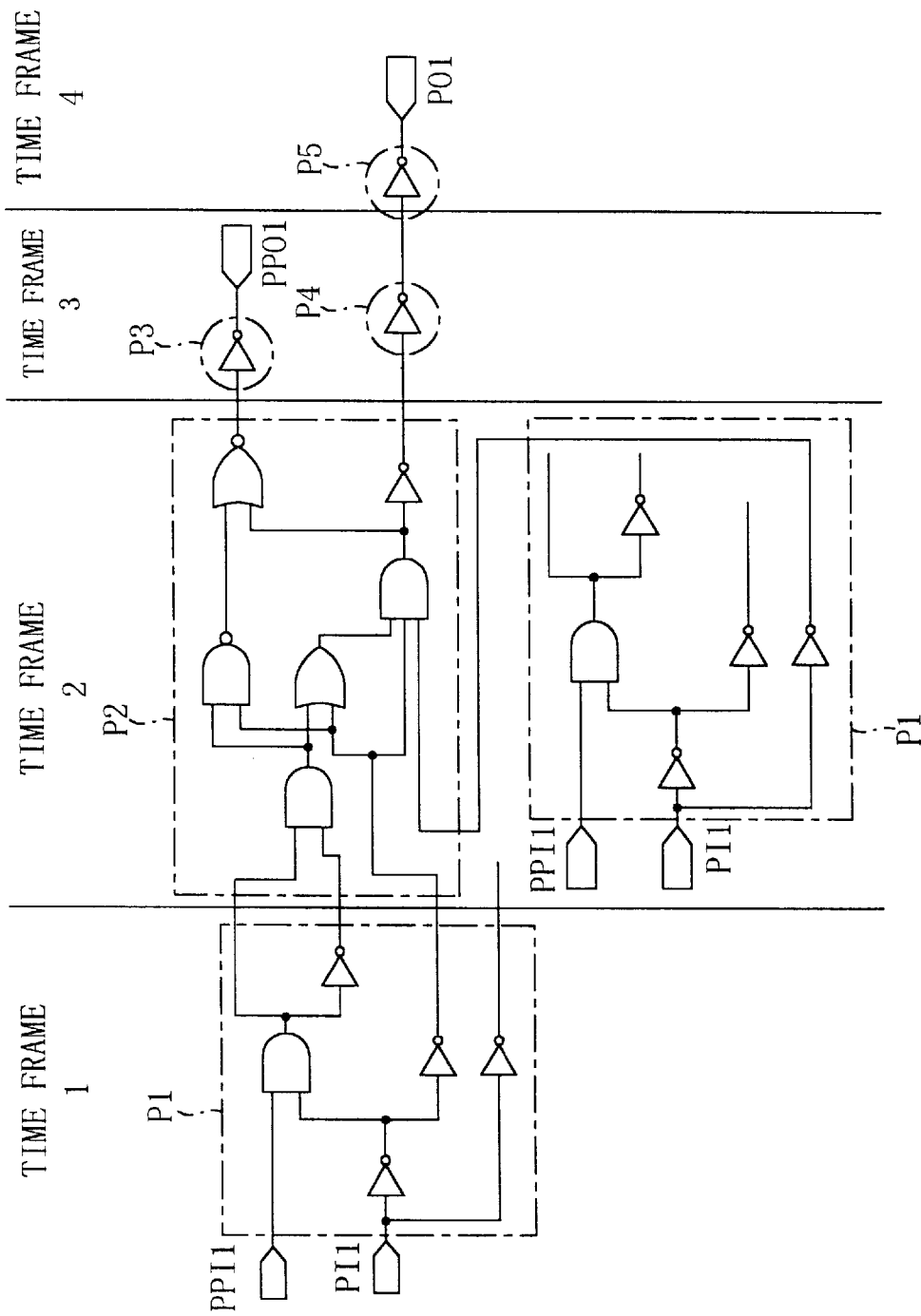
FIG. 25 is a diagram of a timeframe expanded combinational circuit generated from the RTL circuit of FIG. 22 on the basis of the timeframe expanded RTL circuit of FIG. 24.

Then, in step S42, by using each of the groups P1 through P5 obtained in step S40 as one unit, the logic synthesis is conducted, so as to generate gate level combinational circuits respectively corresponding to the groups P1 through P5. In step S43, the gate level combinational circuits generated in step S42 are allocated to each of the groups P1 through P5 of the timeframe expanded RTL circuit generated in step S41 of FIG. 24, so that a timeframe expanded combinational circuit as is shown in FIG. 25 can be generated as the test sequence generating circuit. The procedures thereafter are the same as those described in the third embodiment.

(Embodiment 5)

In a fifth embodiment of the invention, similarly to the third and fourth embodiments, description will be given on a method of test sequence generation for an RTL circuit having the acyclic structure in test or an RTL circuit in which scannable registers are determined and the acyclic structure can be attained in test in assuming a normal data input of a scannable register as a pseudo-primary output and a data output thereof as a pseudo-primary input.

Figure 26:
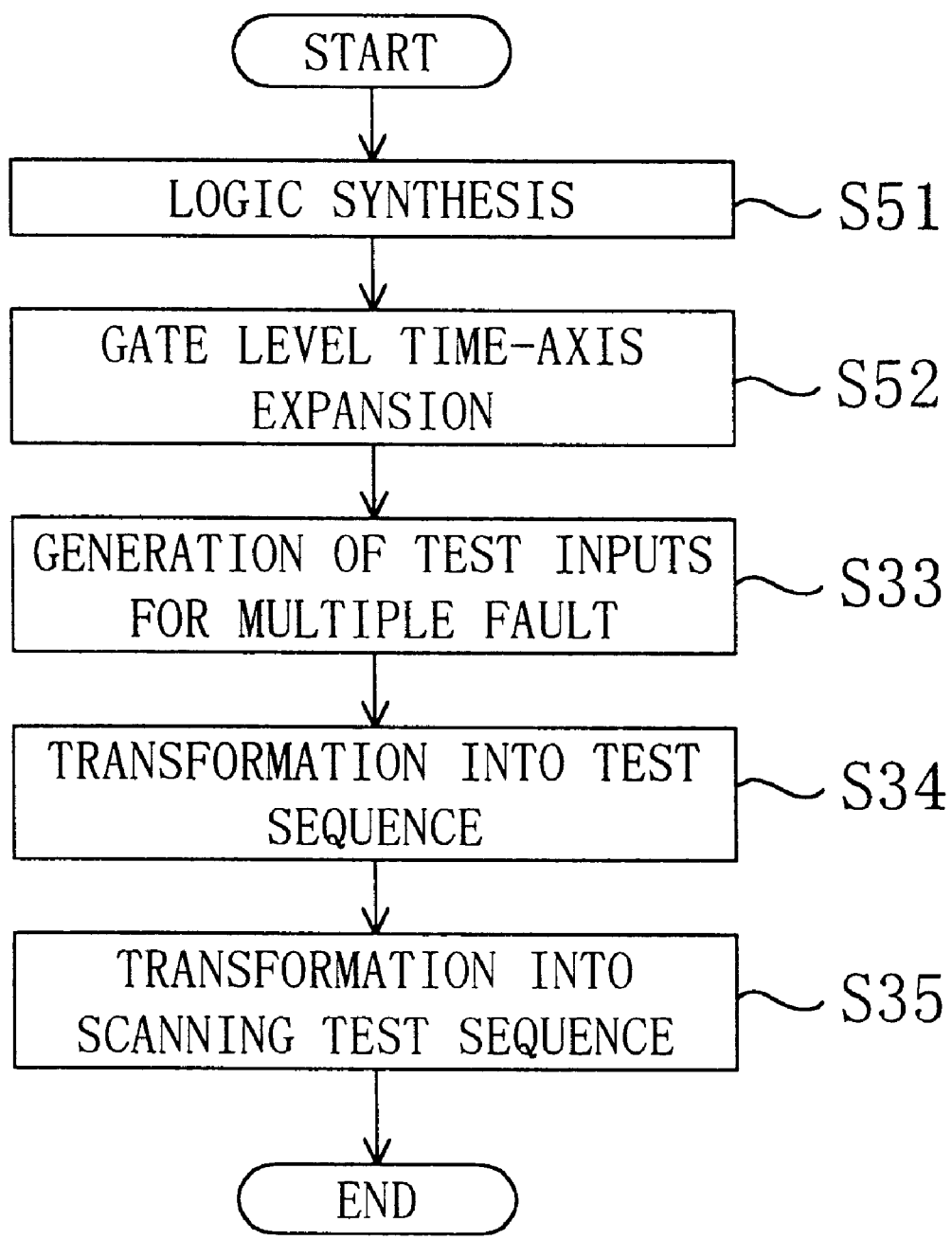
FIG. 26 is a flowchart for showing procedures in a method of test sequence generation according to a fifth embodiment of the invention.

FIG. 26 is a flowchart for showing procedures in the method of test sequence generation of the fifth embodiment. As is shown in FIG. 26, the method of test sequence generation of this embodiment includes the same steps S33 through S35 as the methods of test sequence generation of the third and fourth embodiments.

In step S51, a gate level circuit is generated by logically synthesizing an applied RTL circuit; and in step S52, the gate level circuit generated in step S51 is timeframe expanded, so as to generate a timeframe expanded combinational circuit for test sequence generation, and timeframes including each of the primary inputs and pseudo-primary inputs are stored.

The gate level timeframe expansion in step S52 is conducted on the basis of a predetermined evaluation function as in the RTL timeframe expansion in step S20 of the third embodiment.

For example, by using the total number of gates included in each timeframe as the evaluation function, and the timeframe expanded combinational circuit is generated through the gate level timeframe expansion with making this evaluation function as small as possible. Thus, the size of the combinational circuit for generating test patterns can be minimized, resulting in easily generating test sequences. Alternatively, when the number of timeframes including a pseudo-primary input or a pseudo-primary output is used as the evaluation function, the number of the resultant test sequences can be reduced.

(Embodiment 6)

In a sixth embodiment of the invention, similarly to the third and fourth embodiments, description will be give on a method of test sequence generation for an RTL circuit having the acyclic structure in test or an RTL circuit in which scannable registers are determined and the acyclic structure can be attained in test in assuming a normal data input of a scannable register as a pseudo-primary output and a data output thereof as a pseudo-primary input. In this embodiment, an evaluation function different from that of the third embodiment is used for the timeframe expansion.

In this embodiment, an evaluation function for minimizing the number of timeframes including each pseudo-primary output is used. Specifically, the sum of the total number of timeframes including each pseudo-primary input and the total number of timeframes including each pseudo-primary output is used as the evaluation function. However, when the pseudo-primary input corresponding to a register is included in a timeframe following a timeframe including the pseudo-primary output corresponding to the register, the number of such registers is subtracted from the value of the evaluation function. At this point, a timeframe following the last timeframe corresponds to the first timeframe.

Furthermore, when the test patterns are transformed into test sequences with one scan path formed by using scan FFs composing registers corresponding to each pseudo-primary output disposed in one timeframe and scan FFs composing registers corresponding to each pseudo-primary input disposed in the following timeframe, the length of the test sequences can be shortened.

Figure 27:
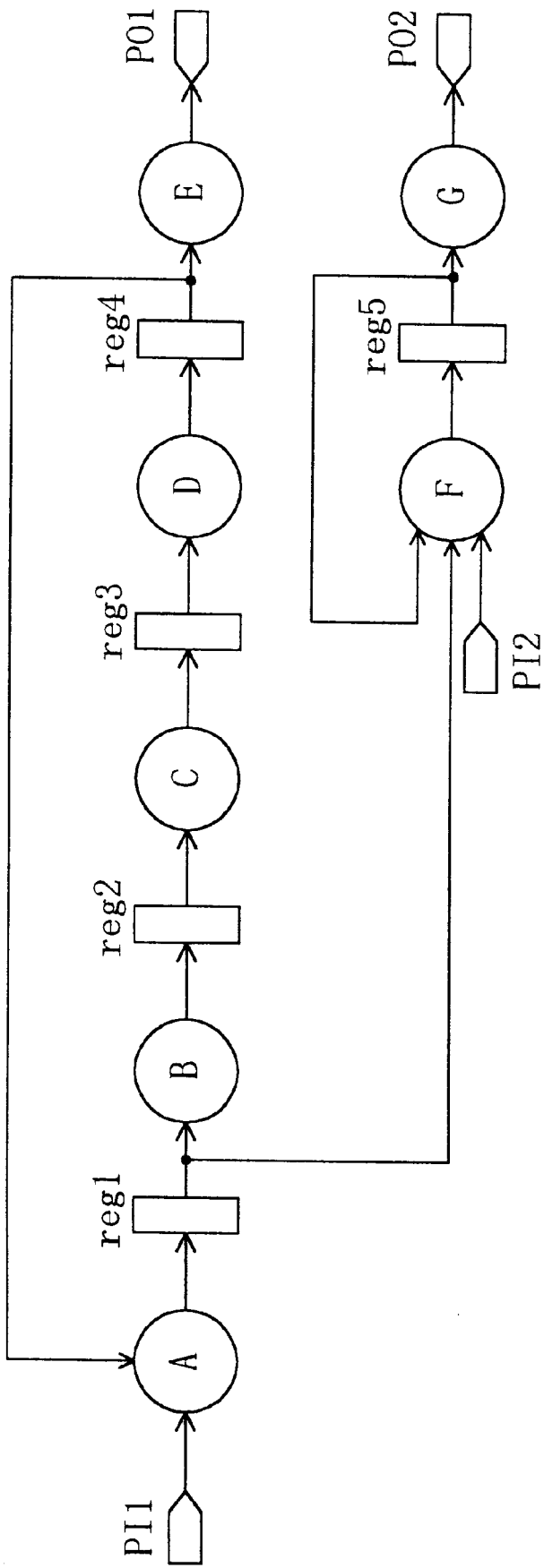
FIG. 27 is a directed graph for showing an example of an RTL circuit applicable to a method of test sequence generation of a sixth embodiment.

FIG. 27 is a directed graph for showing an example of an RTL circuit applicable to the method of test sequence generation of this embodiment. In FIG. 27, A through G indicate combinational facilities, reg1 through reg5 indicate registers, PI1 and PI2 indicate primary inputs, and PO1 and PO2 indicate primary outputs. The RTL circuit of FIG. 27 includes two feedback loops, and the registers reg4 and reg5 are selected as the scannable registers, so as to break the two feedback loops and attain the acyclic structure.

Figure 28:
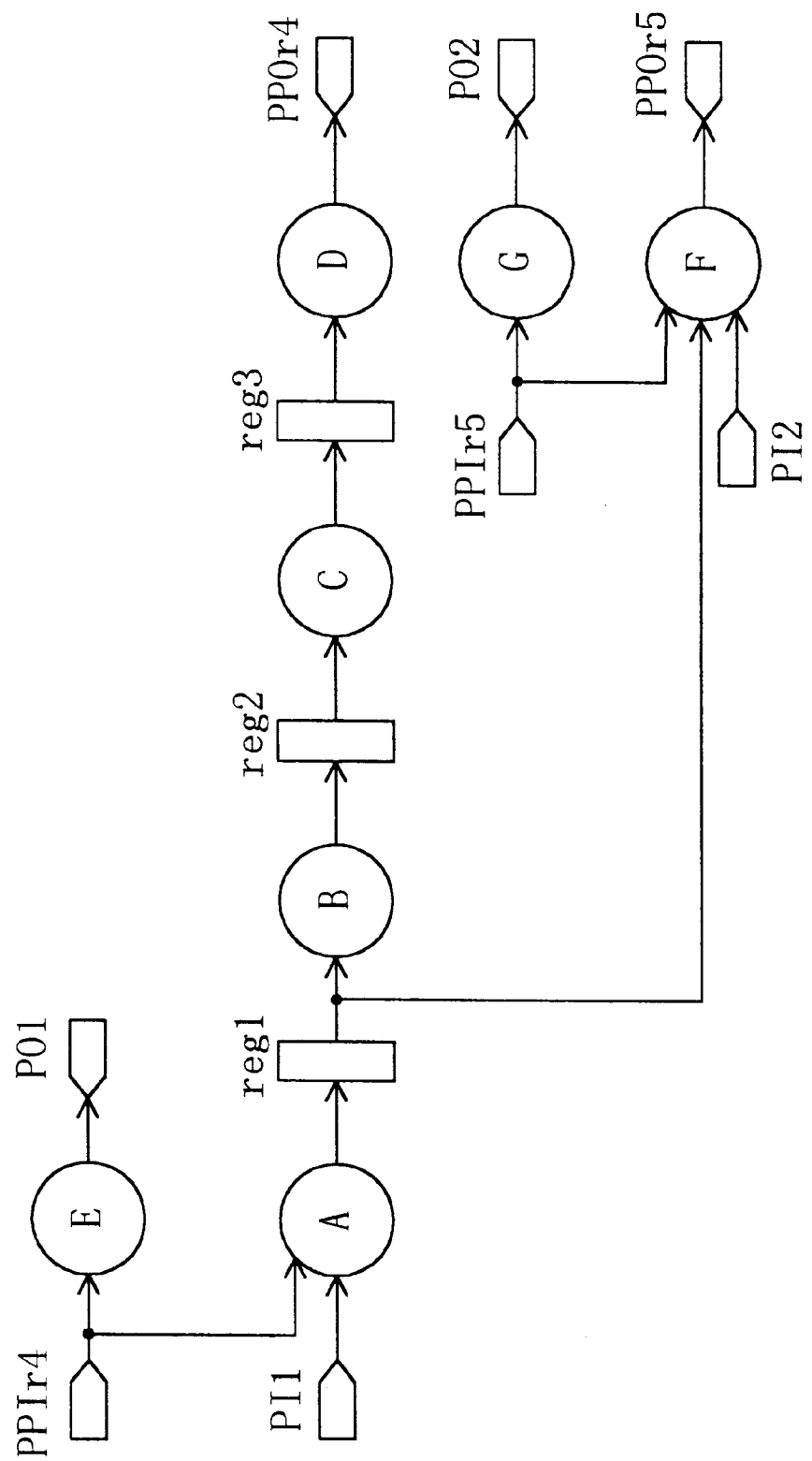
FIG. 28 is a directed graph resulting from assuming scannable registers as pseudo-primary inputs and pseudo-primary outputs in the RTL circuit of FIG. 27.

FIG. 28 is a directed graph obtained in assuming each of the scannable registers with a pseudo-primary input and a pseudo-primary output in the RTL circuit of FIG. 27. In FIG. 28, the register reg4 is assumed as a pseudo-primary input PPIr4 and a pseudo-primary output PPOr4, and the register reg5 is assumed as a pseudo-primary input PPIr5 and a pseudo-primary output PPOr5.

Figure 29:
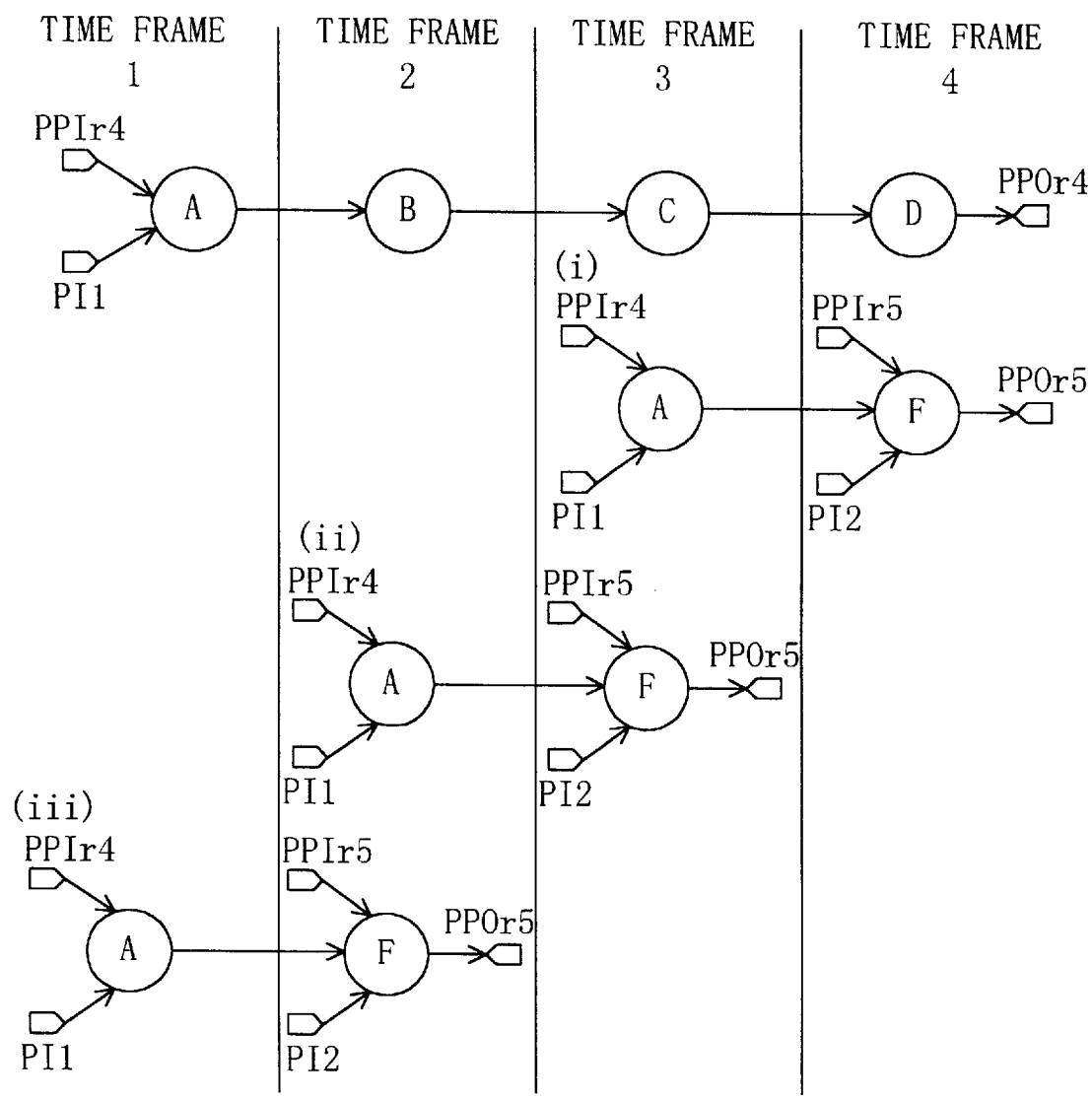
FIG. 29 is a diagram for showing timeframe expansion according to the sixth embodiment on the RTL circuit of FIG. 28.

FIG. 29 is a diagram resulting from the timeframe expansion of this embodiment on the RTL circuit of FIG. 28. Since the RTL circuit of FIG. 28 has a sequential depth (i.e., the maximum value of the maximum sequential depths of each of the primary outputs and pseudo-primary outputs) of 3, the number of timeframes in the timeframe expansion is set at 4 as is shown in FIG. 29. Then, the timeframe expansion is conducted first about the pseudo-primary output PPOr4 having the largest maximum sequential depth.

Next, the timeframe expansion is conducted about the pseudo-primary output PPOr5 having the maximum sequential depth of 1.

When the pseudo-primary output PPOr5 is disposed in the timeframe 4 (as is shown as a case (i) of FIG. 29), the pseudo-primary input PPIr4 is included in the timeframes 1 and 3, the pseudo-primary input PPIr5 is included in the timeframe 4, and the pseudo-primary outputs PPOr4 and PPOr5 are both included in the timeframe 4. In addition, with regard to the register reg4, the pseudo-primary output PPOr4 is included in the timeframe 4 and the pseudo-primary input PPIr4 is included in the timeframe 1. Therefore, the evaluation function has a value of 4 (=3+2–1).

When the pseudo-primary output PPOr5 is disposed in the timeframe 3 (as is shown as a case (ii) of FIG. 29), the pseudo-primary input PPIr4 Is Included In the timeframes 1 and 2, the pseudo-primary input PPIr5 is included in the timeframe 3, the pseudo-primary output PPOr4 is included in the timeframe 4, and the pseudo-primary output PPOr5 is included in the timeframe 3. In addition, with regard to the register reg4, the pseudo-primary output PPOr4 is included In the timeframe 4 and the pseudo-primary input PPIr4 is included in the timeframe 1. Therefore, the evaluation function has a value of 4 (=3+2–1).

When the pseudo-primary output PPOr5 is disposed in the timeframe 2 (as is shown as a case (iii) of FIG. 29), the pseudo-primary input PPIr4 is included in the timeframe 1, the pseudo-primary input PPIr5 is included in the timeframe 2, the pseudo-primary output PPOr4 is included in the timeframe 4, and the pseudo-primary output PPOr5 is included in the timeframe 2. In addition, with regard to the register reg4, the pseudo-primary output PPOr4 is included in the timeframe 4 and the pseudo-primary input PPIr4 is included in the timeframe 1. Therefore, the evaluation function has a value of 3 (=2+2–1).

Accordingly, the pseudo-primary output PPOr5 is determined to be disposed in the timeframe 2 so as to minimize the value of the evaluation function. Similarly, the primary output PO1 is determined to be disposed in the timeframe 1, and the primary output PO2 is determined to be disposed in the timeframe 3.

Figure 30:
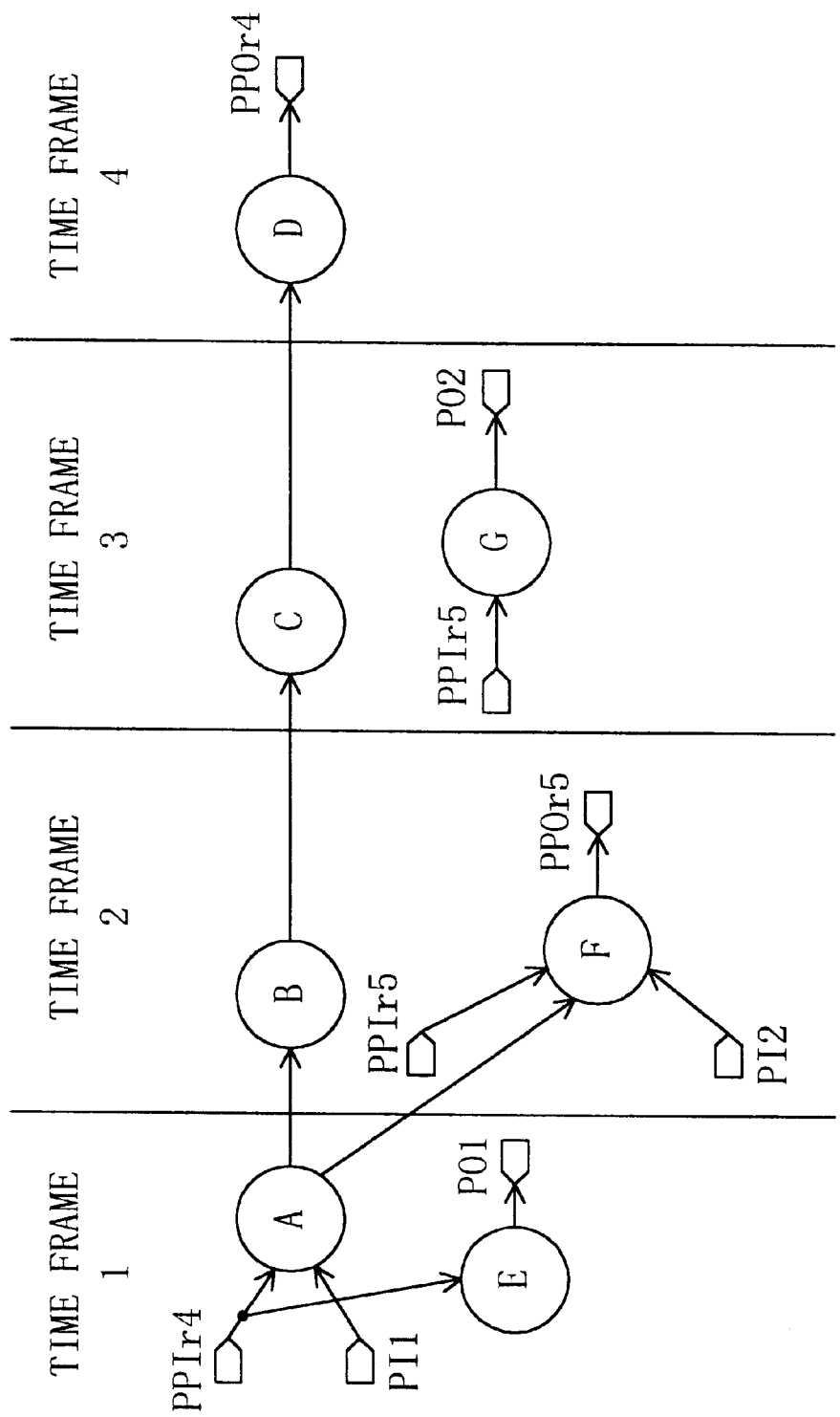
FIG. 30 is a diagram resulting from the timeframe expansion of the sixth embodiment on the RTL circuit of FIG. 28.

As a result, a timeframe expanded RTL circuit as is shown in FIG. 30 is generated. In FIG. 30, the pseudo-primary inputs and pseudo-primary outputs are disposed as follows: the timeframe 1 includes the pseudo-primary input PPIr4 alone, the timeframe 2 includes the pseudo-primary input PPIr5 and the pseudo-primary output PPOr5 alone, the timeframe 3 includes the pseudo-primary input PPIr5 alone, and the timeframe 4 includes the pseudo-primary output PPOr4 alone.

In the timeframe expanded combinational circuit for test sequence generation generated on the basis of the timeframe expanded RTL circuit of FIG. 30, the register reg4 forms one scan path and the register reg5 forms another scan path.

For example, it is assumed that the register reg4 has a data width of 8 bits and the register reg5 has a data width of 4 bits. In this case, the number of FFs composing the registers reg4 and reg5 is 12.

At this point, when two scan paths each including 6 scan FFs are simply formed and each scan path includes the scan FFs of both the registers reg4 and reg5, a shift operation is required in the timeframes 1, 2 and 3, and hence, the length of a test sequence for a shift operation necessary for one test pattern is 18 (=6·3).

On the other hand, when the 8 scan FFs composing the register reg4 together form one scan path and the 4 scan FFs composing the register reg5 together form another scan path, the length of a test sequence for a shift operation necessary for one test pattern is 16 (=8+4·2).

In this manner, through the timeframe expansion by using the evaluation function for minimizing the number of timeframes including each pseudo-primary output, the number of the resultant test sequences can be reduced.

(Embodiment 7)

In a seventh embodiment of the invention, similarly to the third and fourth embodiments, description will be given on a method of test sequence generation for an RTL circuit having the acyclic structure in test or an RTL circuit in which scannable registers are determined and the acyclic structure can be attained in test in assuming a normal data input of a scannable register as a pseudo-primary output and a data output thereof as a pseudo-primary input. In this embodiment, an evaluation function different from that of the third embodiment is used in the timeframe expansion.

In this embodiment, the total number of primary inputs included in each timeframe is used as the evaluation function. The timeframe expansion is conducted with maximizing the value of this evaluation function.

Figure 31:
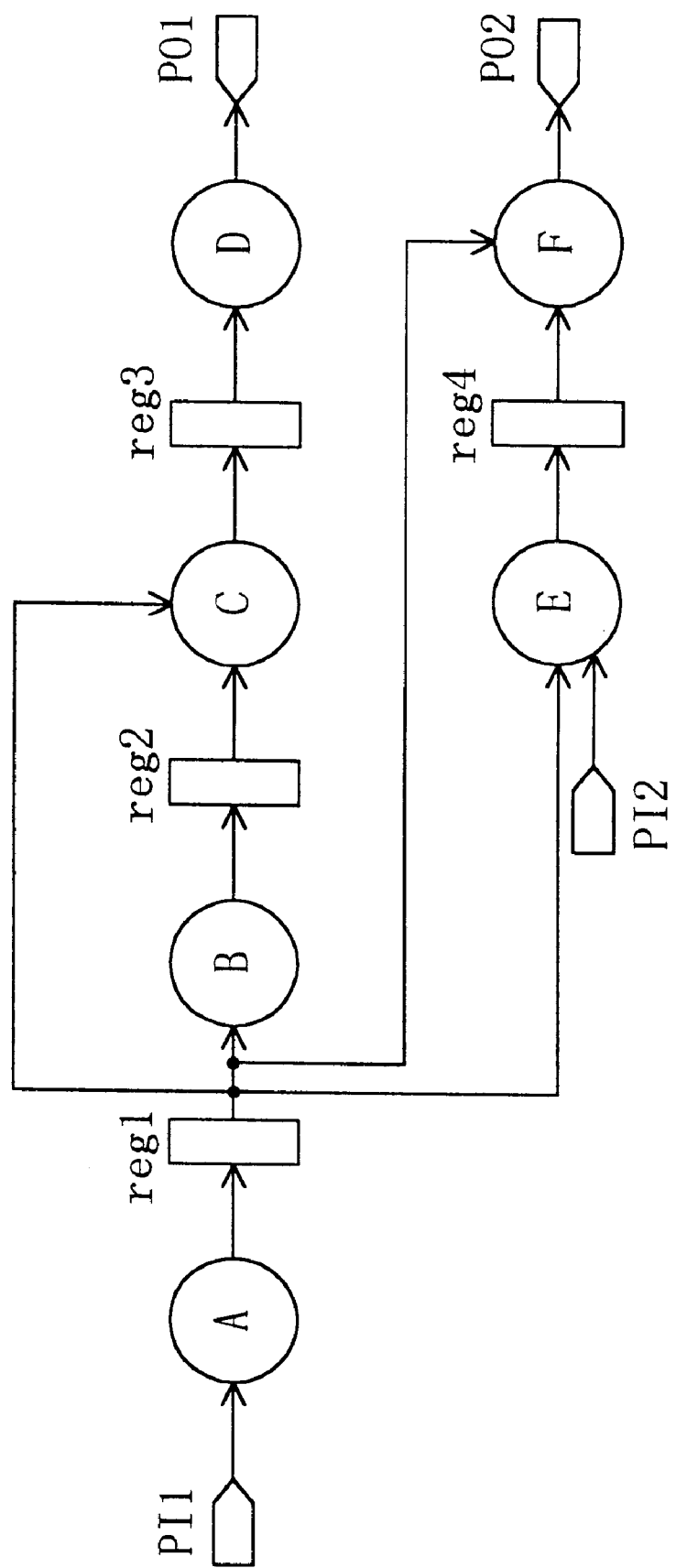
FIG. 31 is a directed graph for showing an example of an RTL circuit applicable to a method of test sequence generation according to a seventh embodiment of the invention.

FIG. 31 is a directed graph for showing an example of an RTL circuit having the acyclic structure applicable to the method of test sequence generation of this embodiment. In FIG. 31, A through F indicate combinational facilities, reg1 through reg4 indicate registers, PI1 and PI2 indicate primary inputs and PO1 and PO2 indicate primary outputs.

Figure 32:
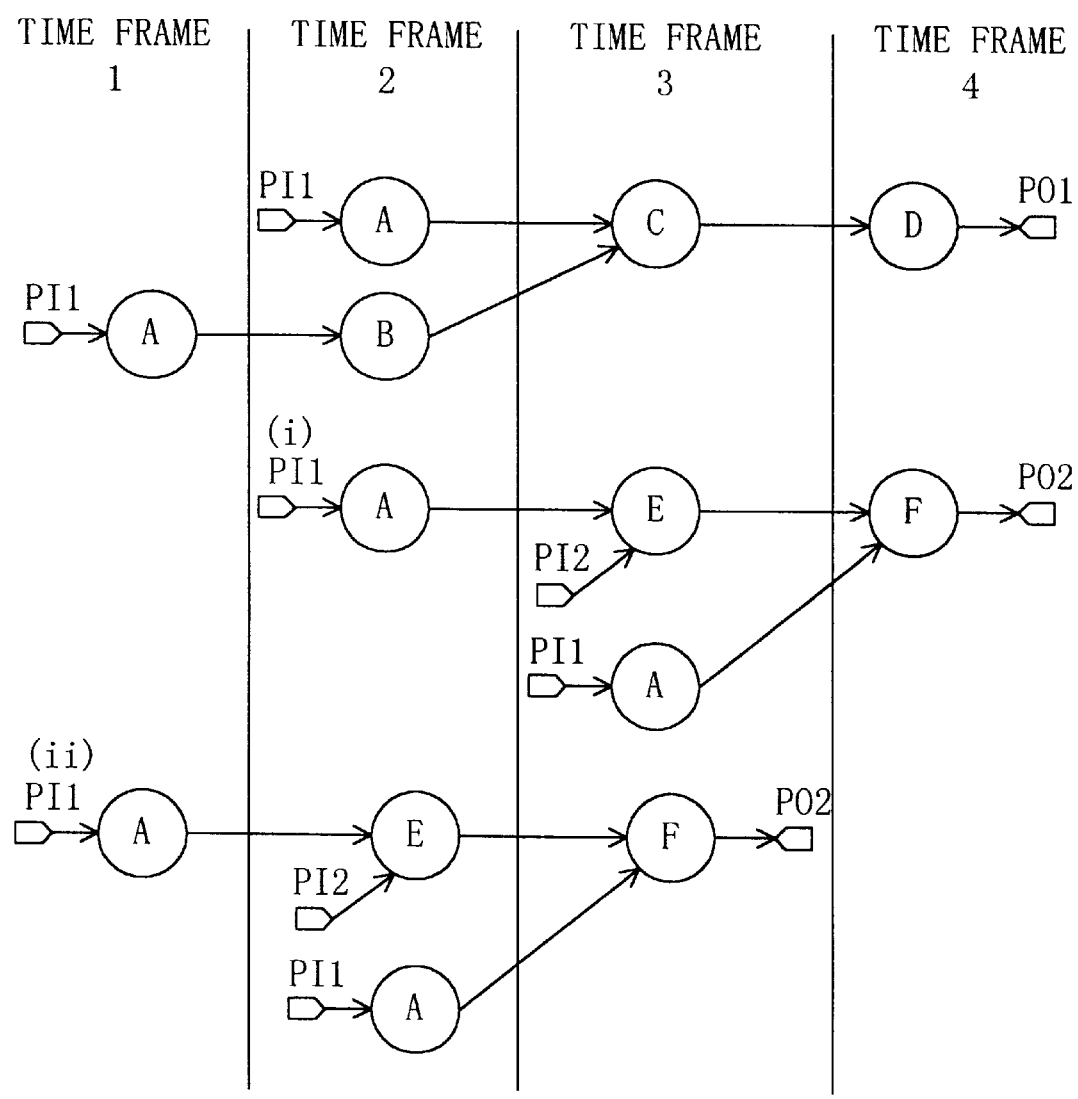
FIG. 32 is a diagram for showing timeframe expansion of the seventh embodiment on the RTL circuit of FIG. 31.

FIG. 32 is a diagram resulting from the timeframe expansion of this embodiment on the RTL circuit of FIG. 31. Since the RTL circuit of FIG. 31 has a sequential depth (namely, the maximum value of the maximum sequential depths of each of primary outputs and pseudo-primary outputs) of 3, the number of timeframes in the timeframe expansion is set at 4 as is shown in FIG. 32. Then, the timeframe expansion is conducted first about the primary output PO1 having the largest maximum sequential depth.

Next, the timeframe expansion is conducted about the primary output PO2. When the primary output PO2 is disposed in the timeframe 4 (as is shown as a case (i) of FIG. 32), the timeframe 1 includes the primary input PI1, the timeframe 2 includes the primary input PI1, and the timeframe 3 includes the primary inputs PI1 and PI2, and hence, the evaluation function has a value of 4 (=1+1+2). On the other hand, when the primary output PO2 is disposed in the timeframe 3 (as is shown as a case (ii) of FIG. 32), the timeframe 1 includes the primary input PI1 and the timeframe 2 includes the primary inputs PI1 and PI2, and hence, the evaluation function has a value of 3 (=1+2). Therefore, the primary output PO2 is determined to be disposed in the timeframe 4 so as to maximize the value of the evaluation function.

Figure 33A:
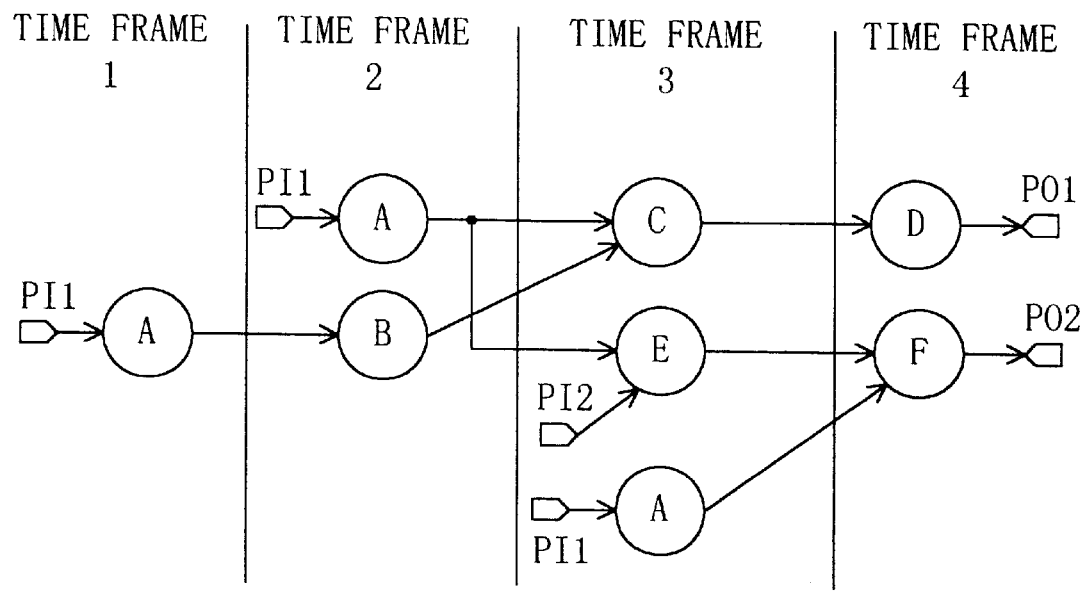
Figure 33B:
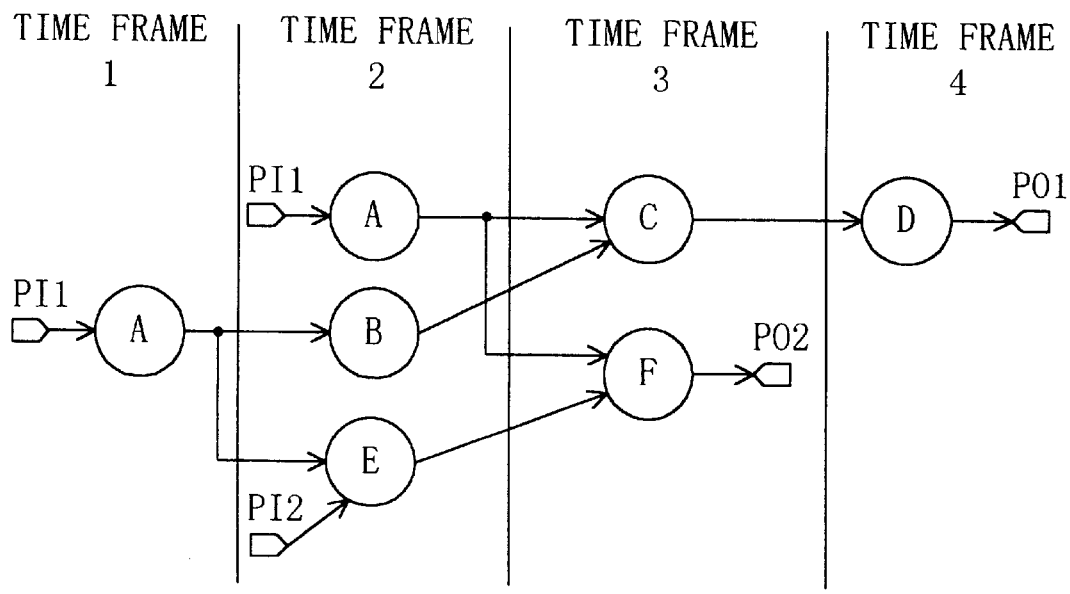

FIGS. 33(a) and 33(b) are diagrams of timeframe expanded RTL circuits generated through the timeframe expansion of this embodiment on the RTL circuit of FIG. 31, wherein the circuit of FIG. 33(a) is obtained by disposing the primary output PO2 in the timeframe 4 and the circuit of FIG. 33(b) is obtained by disposing the primary output PO2 in the timeframe 3.

Figure 34A:
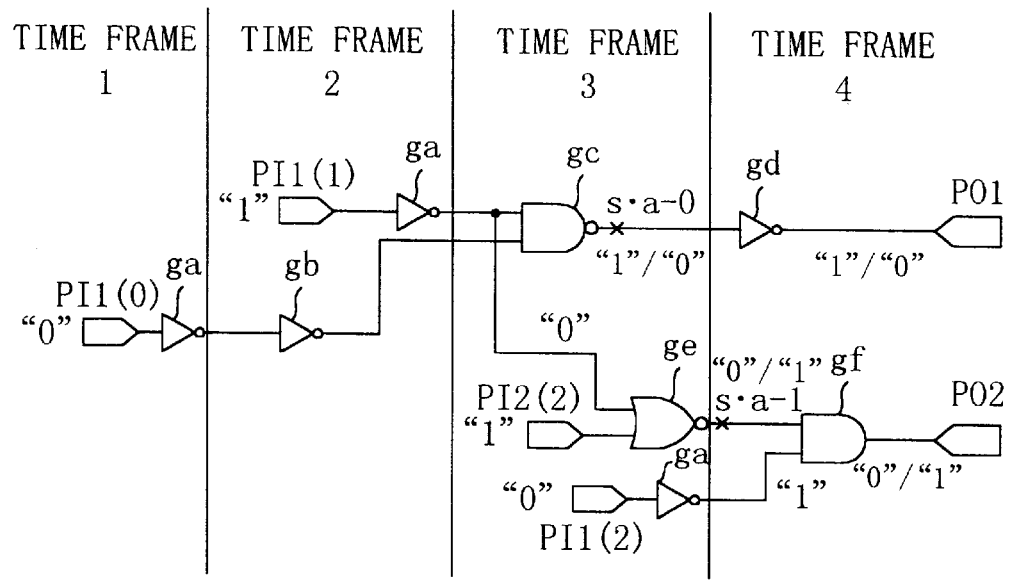
Figure 34B:
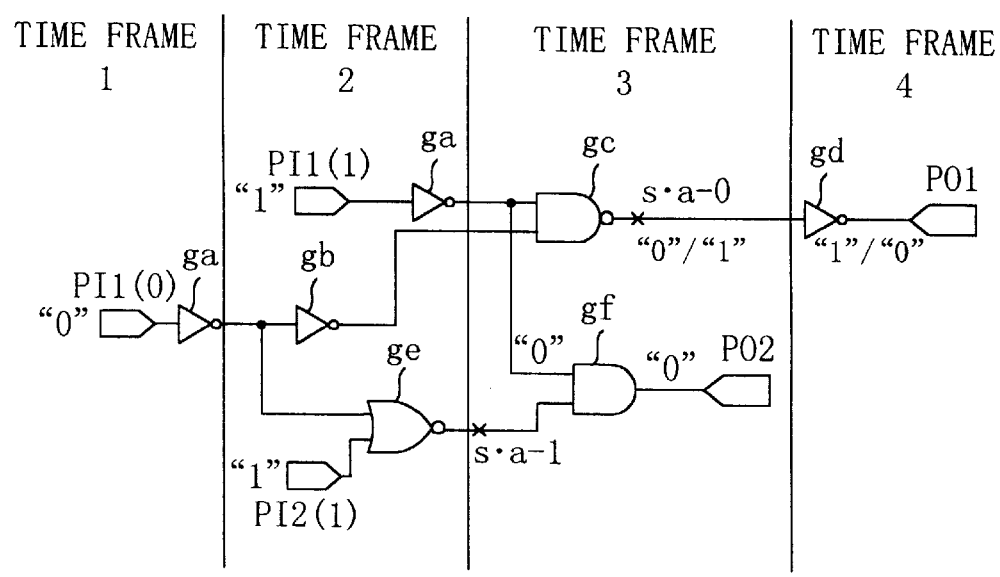

FIGS. 34(a) and 34(b) are diagrams of gate level circuits obtained from the timeframe expanded RTL circuits of FIGS. 33(a) and 33(b), wherein FIG. 34(a) shows the circuit obtained from FIG. 33(a) where the primary output PO2 is disposed in the timeframe 4 and FIG. 34(b) shows the circuit obtained from FIG. 33(b) where the primary output PO2 is disposed in the timeframe 3. In FIGS. 34(a) and 34(b), the combinational facility A is replaced with one NOT gate ga, the combinational facility B is replaced with one NOT gate gb, the combinational facility C is replaced with one NAND gate gc, the combinational facility D is replaced with one NOT gate gd, the combinational facility E is replaced with one NOR gate ge, and the combinational facility F is replaced with one AND gate gf.

In the circuit of FIG. 34(a), test patterns for detecting stuck at "0" fault at the output of the NAND gate gc are:

$PI1(0)=0, PI1(1)=1, PI1(2)=0, PI2(2)=1$ and by using the same test patterns, stuck at "1" fault at the output of the NOR gate ge can be also detected. On the other hand, in the circuit of FIG. 34(b), test patterns for detecting stuck at "0" fault at the output of the NAND gate gc are:

$PI1(0)=0, PI1(1)=1, PI2(1)=1$

According to these test patterns, one input of the AND gate gf is always "0" because PI1(1)=1, and hence, the output of the AND gate gf is always "0". Accordingly, stuck at "1" fault at the output of the NOR gate ge cannot be detected by using these test patterns.

In this manner, when the number of the primary inputs included in each timeframe is larger, the number of detectable faults by using one test pattern is larger, resulting in shortening the necessary length of a test pattern. Accordingly, through the timeframe expansion on the basis of the evaluation function of this embodiment, the length of the resultant test sequences can be shortened.

The evaluation functions described in the sixth and seventh embodiments can be used also in the case where the timeframe expansion is conducted at gate level as in the fifth embodiment.

(Embodiment 8)

In an eighth embodiment of the invention, a method of design for testability similar to that of the first embodiment is described, in which an RTL circuit is partitioned into plural blocks and scannable registers are selected in each block so that each block can attain an easily testable circuit structure.

Figure 35:
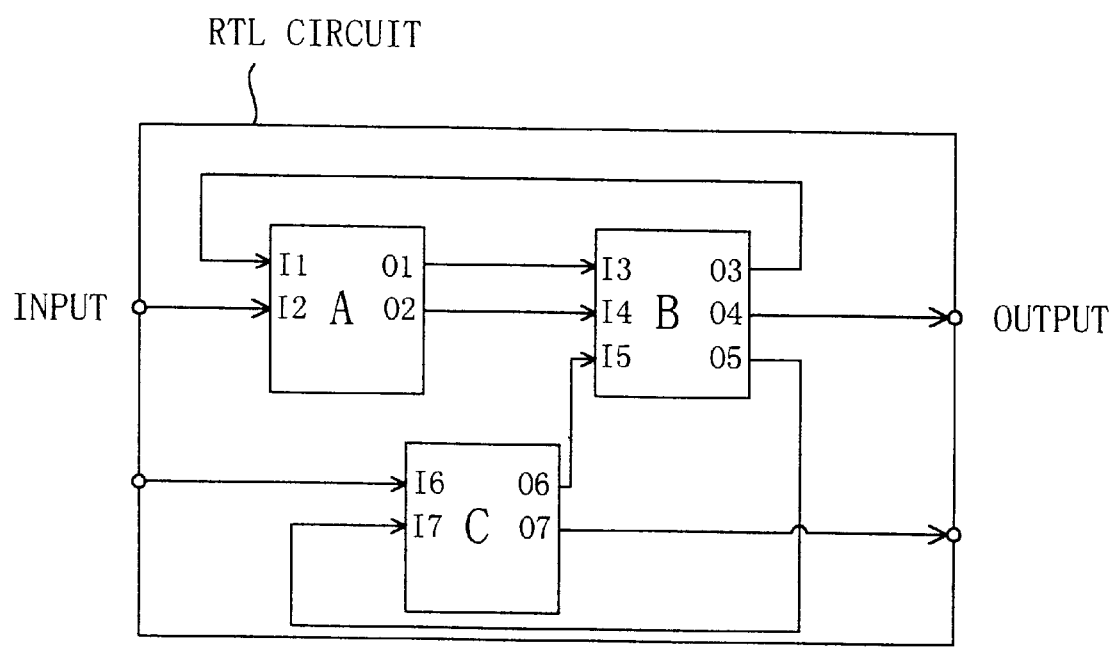
FIG. 35 is a schematic diagram for showing an example of an RTL circuit applicable to a method of design for testability according to an eighth embodiment of the invention.

FIG. 35 is a schematic diagram of an RTL circuit partitioned into plural blocks. The RTL circuit of FIG. 35 is partitioned into three blocks A, B and C. However, since the blocks A, B and C together form a feedback loop, the entire RTL circuit cannot be made easily testable simply by attaining an easily testable circuit structure in each block A, B and C. Since test sequences are generated with regard to the entire LSI, high fault coverage cannot be achieved unless the entire LSI is easily testable.

In each block, a register which can be reached, in a direction from the output to the input of the block, by passing merely through combinational facilities is selected as the scannable register. Then, scannable registers are selected so that each block can attain an easily testable circuit structure.

Figure 36A:
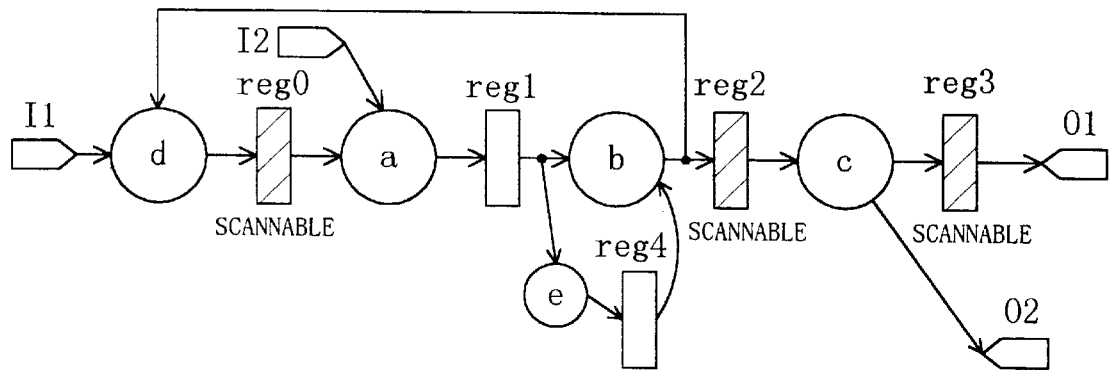
Figure 36B:
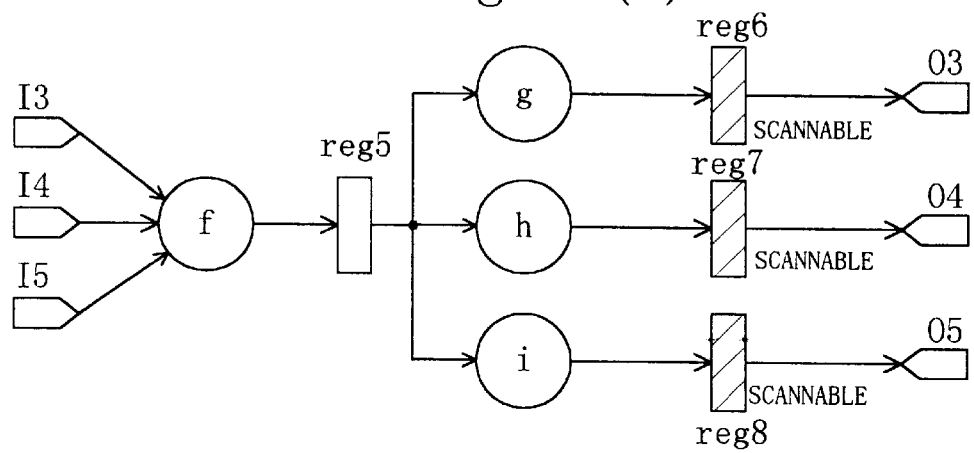
Figure 36C:
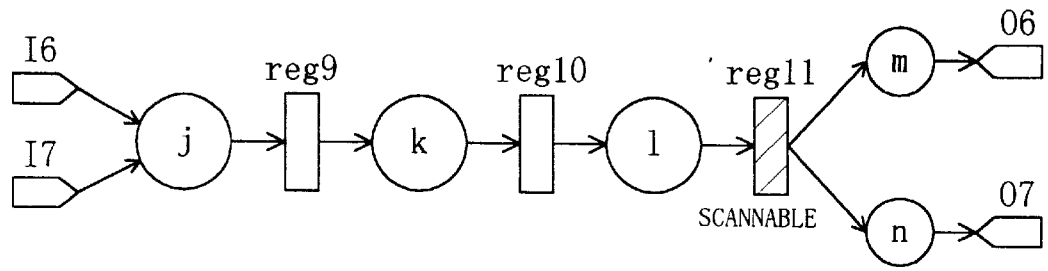

FIGS. 36(a) through 36(c) are directed graphs for showing the structures of each block of the RTL circuit of FIG. 35, wherein FIG. 36(a) shows the block A, FIG. 36(b) shows the block B and FIG. 36(c) shows the block C. In FIGS. 36(a) through 36(c), a through n indicate combinational facilities, reg0 through reg11 indicate registers, I1 through I7 indicate the inputs of the blocks, and O1 through O7 indicate the outputs of the blocks.

First, in each of the blocks A, B and C, a register which can be reached, in the direction from the output to the input of the block, by passing merely through the combinational facilities is selected as the scannable register. In the block A, the register reg3 which can be directly reached from the output O1 and the register reg2 which can be reached from the output O2 through the combinational facility c are selected as the scannable registers as is shown in FIG. 36(a). In the block B, the register reg6 which can be directly reached from the output O3, the register reg7 which can be directly reached from the output O4 and the register reg8 which can be directly reached from the output O5 are selected as the scannable registers as is shown in FIG. 36(b). In the block C, the register reg11 which can be directly reached from the outputs O6 and O7 is selected as the scannable register as is shown in FIG. 36(c).

Then, scannable registers are selected so that each of the blocks A, B and C can attain an easily testable circuit structure. In this embodiment, the acyclic structure is specified as the easily testable circuit structure. In this case, the block A includes a loop which is not broken yet and consists of the registers reg0 and reg1 and the combinational facilities a, b and d. Therefore, the register reg0 is selected as the scannable register in order to break this loop.

In this manner, the registers reg0, reg2, reg3, reg6, reg7, reg8 and reg11 hatched in FIGS. 36(a) through 36(c) are selected as the scannable registers. Thus, the entire RTL circuit is designed for testability, and high fault coverage can be guaranteed.

(Embodiment 9)

In a ninth embodiment of the invention, a method of design for testability similar to that of the first embodiment will be described. In this embodiment, a circuit structure different from that of the first embodiment is specified as the easily testable circuit structure.

In this embodiment, a circuit structure attaining multiplicity of n (wherein n is a natural number) as a result of the timeframe expansion is specified as the easily testable circuit structure. Specifically, the easily testable structure specified in this embodiment is a structure in which the types of register sets, each including a different number of registers not to be made scannable, is n or less in paths between a primary input or pseudo-primary input and a primary output or pseudo-primary output in assuming a normal data input of a scannable register as a pseudo-primary output and a data output thereof as a pseudo-primary input. Such a circuit structure is herein designated as an "n-fold acyclic structure". When n is 1, the n-fold acyclic structure is identical to the balanced structure.

Figure 37:
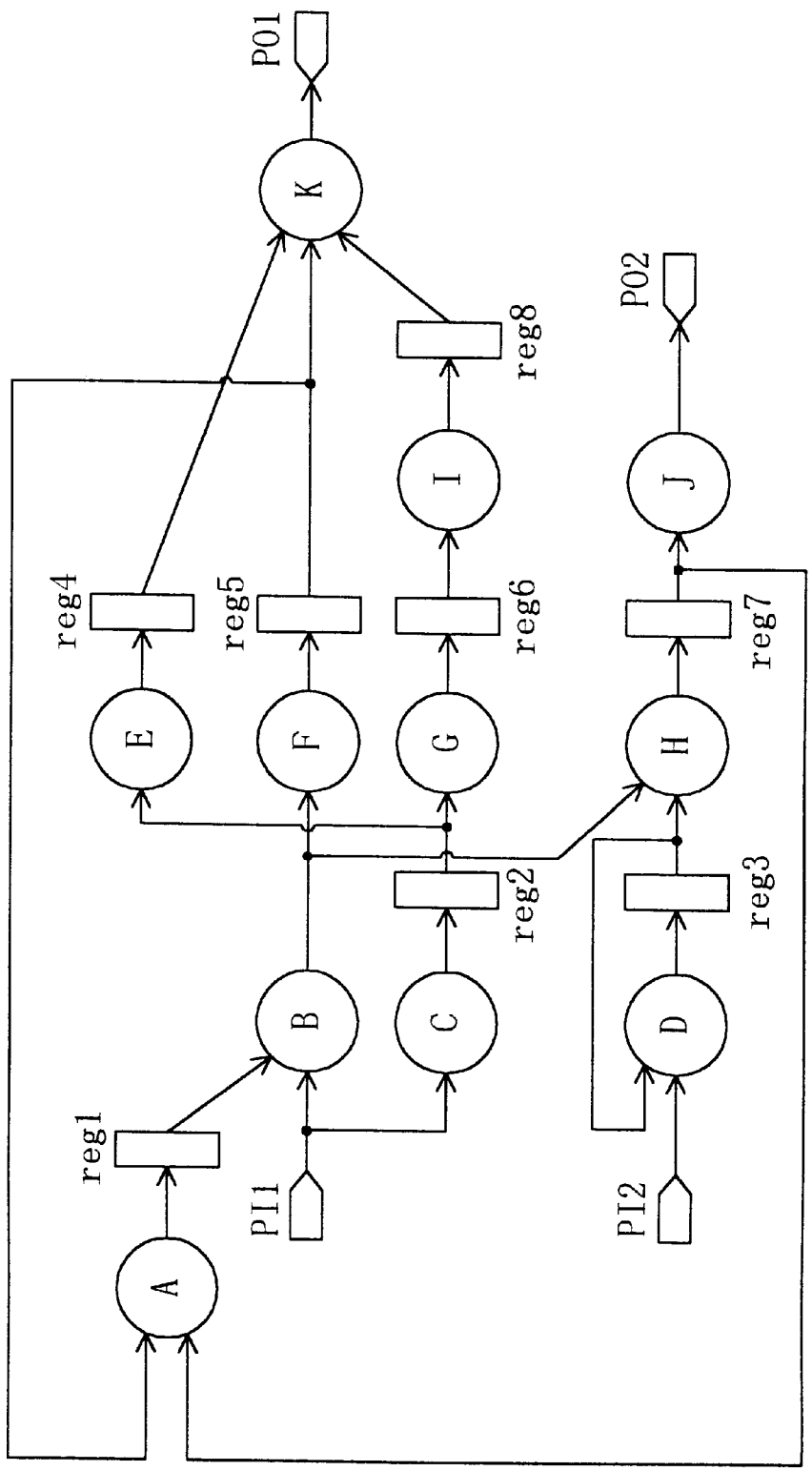
FIG. 37 is a directed graph for showing an example of an RTL circuit applicable to a method of design for testability according to a ninth embodiment of the invention.

FIG. 37 is a directed graph for showing an example of an RTL circuit applicable to the method of design for testability of this embodiment. In FIG. 37, A through K indicate combinational facilities, reg1 through reg8 indicate registers, PI1 and PI2 indicate primary inputs and PO1 and PO2 indicate primary outputs.

Now, the RTL circuit of FIG. 37 is designed for testability by specifying a two-fold acyclic structure as the easily testable circuit structure. As is shown in FIG. 37, the original directed graph includes three feedback loops: a loop consisting of the registers reg1 and reg5 and the combinational facilities A, B and F; a loop consisting of the registers reg1 and reg7 and the combinational facilities A, B and H; and a loop consisting of the register reg3 and the combinational facility D. Therefore, in order to break these loops, the registers reg1 and reg3 are first selected as the scannable registers.

At this point, there are: a path including the one register reg5 not to be made scannable; a path including the two registers reg2 and reg4 not to be made scannable; and a path including the three registers reg2, reg6 and reg8 not to be made scannable between the primary input PI1 and the primary output PO1. Therefore, this RTL circuit has a three-fold acyclic structure. In order to make this circuit have the two-fold acyclic structure, the register reg6 is selected as the scannable register.

Figure 38:
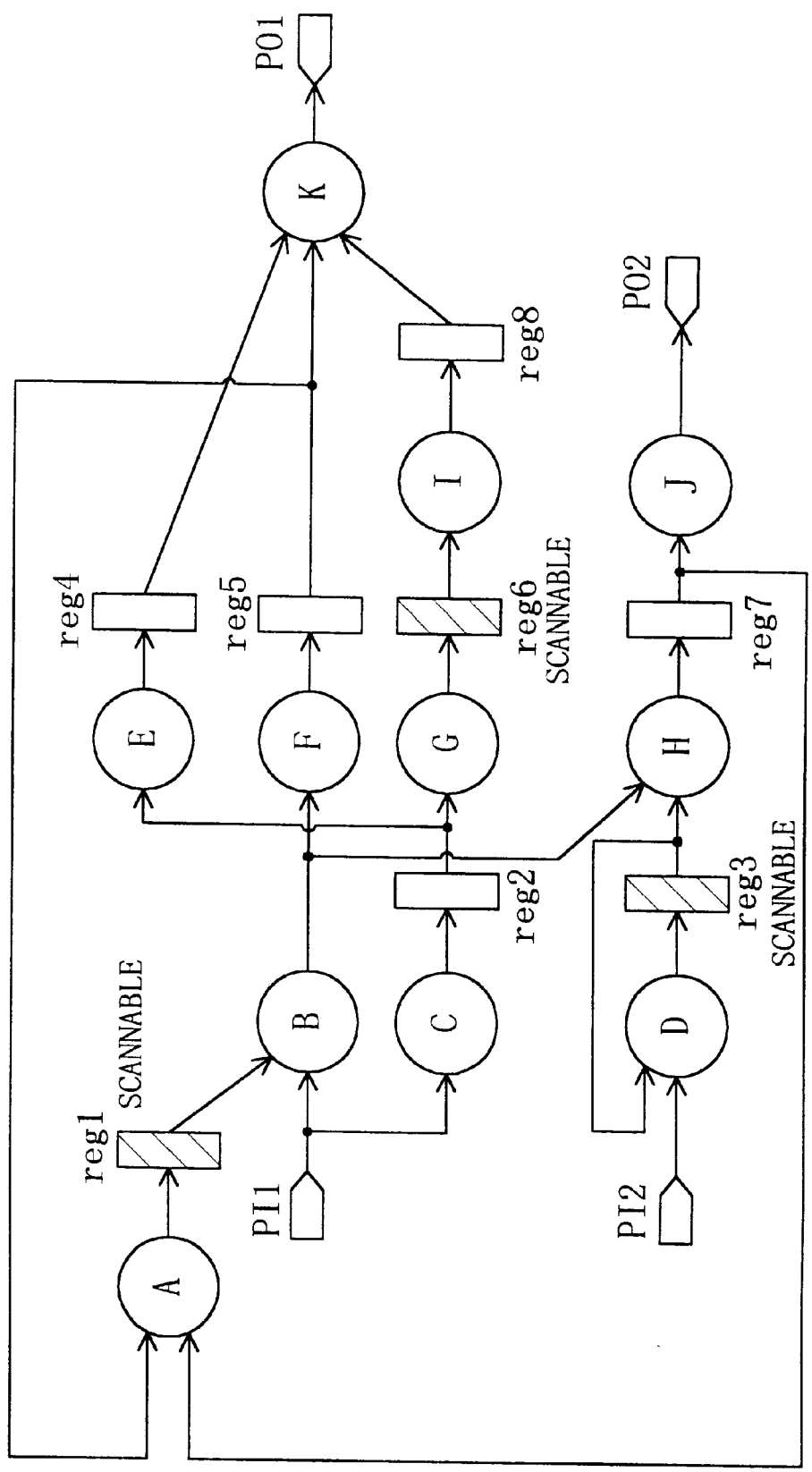
FIG. 38 is a directed graph resulting from the design for testability of the ninth embodiment on the RTL circuit of FIG. 37.

As a result of the aforementioned procedures, the RTL circuit of FIG. 37 is designed for testability as is shown in FIG. 38. The RTL circuit of FIG. 38 has the two-fold acyclic structure because the hatched registers reg1, reg3 and reg6 are selected as the scannable registers. When the RTL circuit of FIG. 38 is timeframe expanded, the resultant timeframe expanded circuit has multiplicity of 2, and hence, it is sufficient to consider a fault of up to two-fold in generating multiple fault test patterns. In this manner, by specifying the n-fold acyclic structure as the easily testable circuit structure, test sequences can be easily generated because the multiplicity to be considered in generating multiple fault test patterns can be limited to n.

(Embodiment 10)

In a tenth embodiment of the Invention, a method of design for testability similar to that of the first embodiment will be described. In this embodiment, a different circuit structure is specified as the easily testable circuit structure from that of the first embodiment.

In this embodiment, the easily testable structure is specified as a structure in which the number of stages of gates is n or less in each path from primary inputs or pseudo-primary inputs to primary outputs or pseudo-primary outputs in assuming a normal data input of a scannable register as a pseudo-primary output and a data output thereof as a pseudo-primary input. As a premise, it Is necessary to estimate the number of stages of gates in each of combinational facilities of an RTL circuit.

Figure 39:
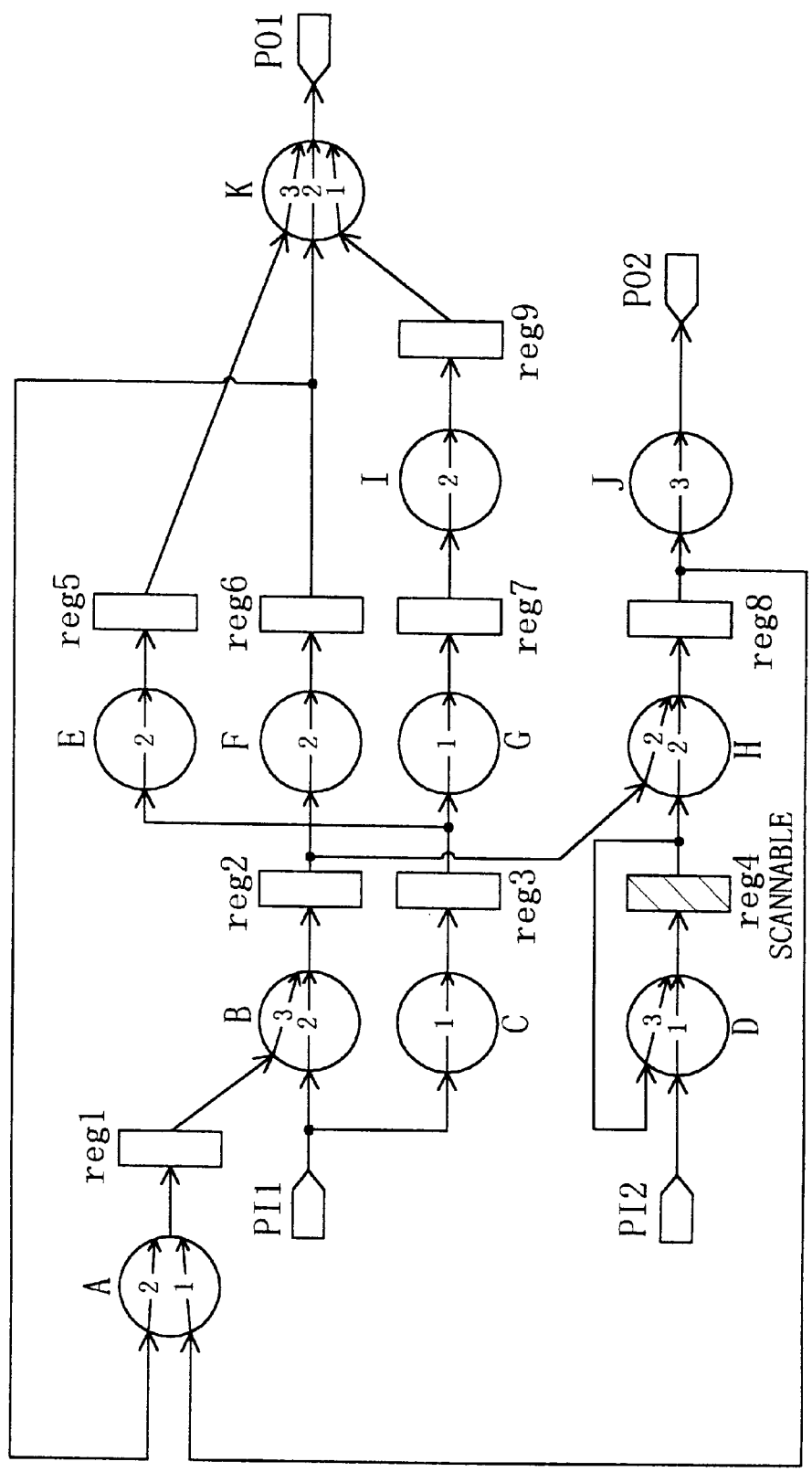
FIG. 39 is a directed graph for showing an example of an RTL circuit applicable to a method of design for testability according to a tenth embodiment of the invention.

FIG. 39 is a directed graph for showing an example of an RTL circuit applicable to the method of design for testability of this embodiment. In FIG. 39, A through K indicate combinational facilities, reg1 through reg9 indicate registers, PI1 and PI2 indicate primary inputs, and PO1 and PO2 indicate primary outputs. As is shown in FIG. 39, the number of stages of gates is estimated in each of the combinational facilities A through K. For example, in the combinational facility A, the numbers of stages of gates in two paths are estimated as 2 and 1, respectively.

Now, the RTL circuit of FIG. 39 is designed for testability by specifying, as the easily testable structure, a structure in which the number of stages of gates is 5 or less in each of paths from primary inputs or pseudo-primary inputs to primary outputs or pseudo-primary outputs.

First, in order to break a loop consisting of the register reg4 and the combinational facility D, the register reg4 is selected as the scannable register.

Next, in order to break a loop consisting of the registers reg1, reg2 and reg6 and the combinational facilities A, B and F, any of the registers reg1, reg2 and reg6 is selected as the scannable register.

When the register reg1 is assumed to be selected as the scannable register, the following five paths have more than 5 stages of gates: a path from the register reg1 to the primary output PO1 (having 7 stages of gates); a path from the register reg1 to the register reg1 (having 7 stages of gates); a path from the register reg1 to the primary output PO2 (having 8 stages of gates); a path from the primary input PI1 to the primary output PO1 (having 6 stages of gates); and a path from the primary input PI1 to the primary output PO2 (having 7 stages of gates).

When the register reg2 is assumed to be selected as the scannable register, the following three paths have more than 5 stages of gates: a path from the register reg2 to the register reg2 (having 7 stages of gates); a path from the primary input PI1 to the primary output PO1 (having 6 stages of gates); and a path from the register reg4 to the register reg2 (having 6 stages of gates).

When the register reg6 is assumed to be selected as the scannable register, the following five paths have more than 5 stages of gates: a path from the register reg6 to the register reg6 (having 7 stages of gates); a path from the primary input PI1 to the primary output PO1 (having 6 stages of gates); a path from the primary input PI1 to the primary output PO2 (having 7 stages of gates); a path from the register reg4 to the primary output PO1 (having 10 stages of gates); and a path from the register reg4 to the primary output PO2 (having infinite stages of gates).

Accordingly, the register reg2 is selected as the scannable register because the number of paths having more than 5 stages of gates is smallest when this register reg2 is selected.

By selecting the register reg2 as the scannable register, a loop consisting of the registers reg1, reg2 and reg8 and the combinational facilities A, B and H can also be broken.

Next, any of the registers contained in the remaining paths having more than 5 stages of gates is selected as the scannable register, so that none of the paths has more than 5 stages of gates. As the paths having more than 5 stages of gates, there remain the path from the register reg2 through the registers reg6 and reg1 to the register reg2 (having 7 stages of gates), the path from the primary input PI1 through the registers reg3 and reg5 to the primary output PO1 (having 6 stages of gates), and the path from the register reg4 through the registers reg8 and reg1 to the register reg2 (having 6 stages of gates). Therefore, any of the registers reg1, reg3, reg5, reg6 and reg8 is selected as the scannable register.

When the register reg1 is assumed to be selected as the scannable register, there remains merely one path having more than 5 stages of gates. When any of the other registers reg3, reg5, reg6 and reg8 is assumed to be selected as the scannable register, there remain two paths having more than 5 stages of gates. Therefore, the register reg1 is selected as the scannable register.

Thus, merely the path from the primary input PI1 through the registers reg3 and reg5 to the primary output PO1 (having 6 stages of gates) remains as the path having more than 5 stages of gates. When any of the registers reg3 and reg5 is selected as the scannable register, no path in the RTL circuit has more than 5 stages of gates. At this point, the register reg5 is selected as the scannable register.

Figure 40:
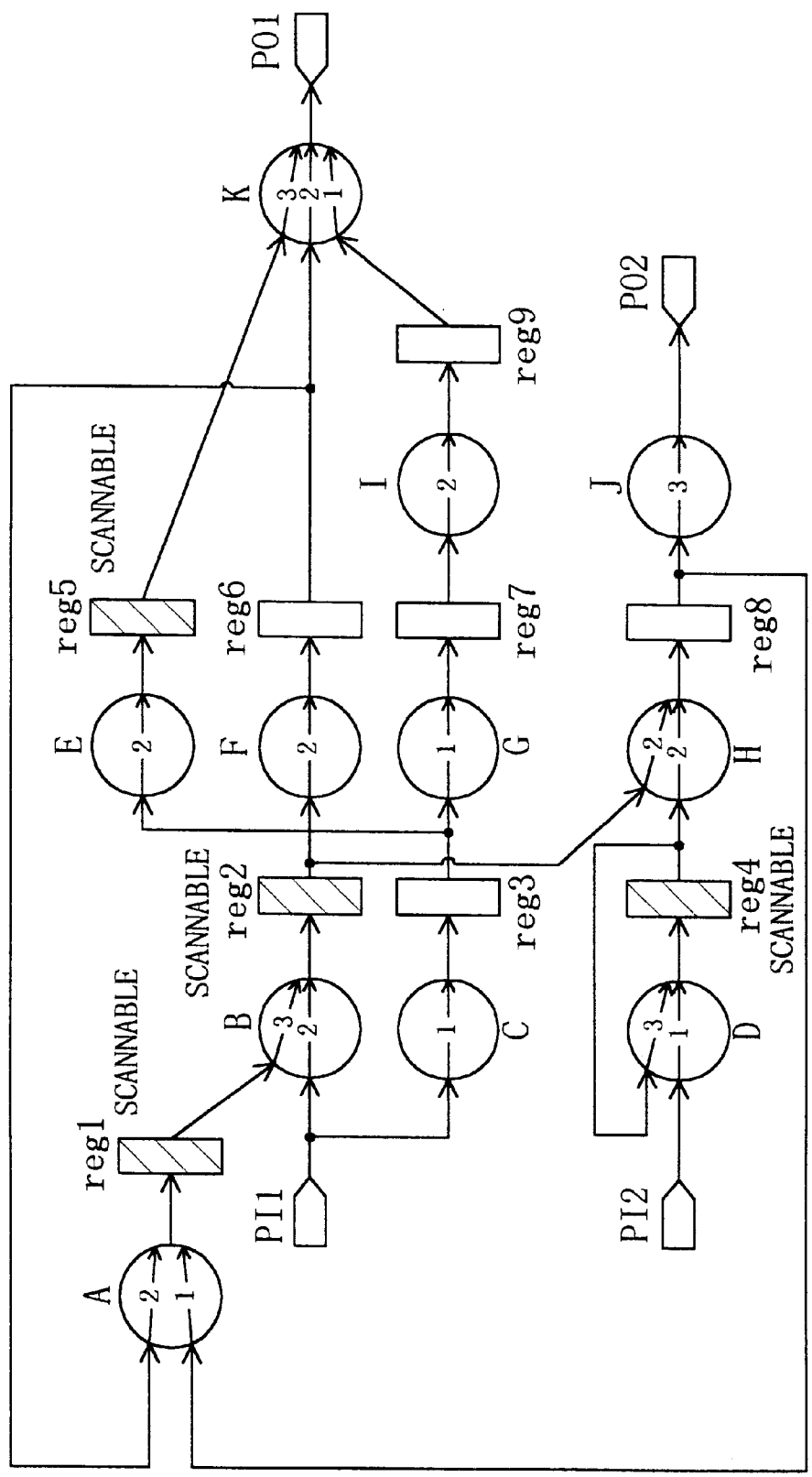
FIG. 40 is a directed graph resulting from the design for testability of the tenth embodiment on the RTL circuit of FIG. 39.

As a result of the aforementioned procedures, the RTL circuit of FIG. 39 is designed for testability as is shown in FIG. 40. In the RTL circuit of FIG. 40, since the hatched registers reg1, reg2, reg4 and reg5 are selected as the scannable registers, each path from the primary inputs or pseudo-primary inputs to the primary outputs or pseudo-primary outputs has 5 or less stages of gates. When the RTL circuit of FIG. 40 is timeframe expanded, the number of stages of gates in each timeframe can probably be 5 or less. Test patterns for a combinational circuit are generally difficult to generate when the number of stages of gates is larger. Therefore, by specifying the structure in which each path from primary inputs or pseudo-primary inputs to primary outputs or pseudo-primary outputs has n or less stages of gates as the easily testable circuit structure as in this embodiment, test patterns can be easily generated.

What is claimed is:

1. A method of design for testability for modifying design of an RTL circuit, that is, an integrated circuit designed at register transfer level, so as to attain testability after manufacture, comprising:
   a first step of specifying as an easily testable circuit structure, an n-fold line-up structure in which paths between an arbitrary pair of a register of the circuit and a primary output or a pseudo-primary output have n or less sorts of sequential depths, where n is a natural number, and specifying a value of n; and
   a second step of selecting scannable registers among registers included in said RTL circuit so that said RTL circuit in test has said easily testable circuit structure specified in said first step in assuming a normal data input of a scannable register as a pseudo-primary output and a data output thereof as a pseudo-primary input.

2. A method of design for testability for modifying design of an RTL circuit, that is, an integrated circuit designed at register transfer level, so as to attain testability after manufacture, comprising:
   a first step of specifying as an easily testable circuit structure, an n-fold acyclic structure in which paths from a primary or pseudo-primary input to a primary or pseudo-primary output contain n or less types of register sets, each said type of register set includes a different number of registers, where n is a natural number, and specifying a value of n; and
   a second step of selecting scannable registers among registers included in said RTL circuit so that said RTL circuit in test has said easily testable circuit structure specified in said first step in assuming a normal data input of a scannable register as a pseudo-primary output and a data output thereof as a pseudo-primary input.

3. A method of design for testability for modifying design of an RTL circuit, that is, an integrated circuit designed at register transfer level, so as to attain testability after manufacture, comprising:
   a first step of specifying as an easily testable circuit structure, a structure in which each of paths from primary or pseudo-primary inputs to primary or pseudo-primary outputs contains n or less stages of gates, where n is 0 or a natural number, and specifying a value of n; and
   a second step of selecting scannable registers among registers included in said RTL circuit so that said RTL circuit in test has said easily testable circuit structure specified in said first step in assuming a normal data input of a scannable register as a pseudo-primary output and a data output thereof as a pseudo-primary input.

4. A method of design for testability for modifying design of an RTL circuit, that is, an integrated circuit designed at register transfer level, so as to attain testability after manufacture, comprising:
   a first step of specifying an easily testable circuit structure; and
   a second step of selecting scannable registers among registers included in said RTL circuit so that said RTL circuit in test has said easily testable circuit structure specified in said first step in assuming a normal data input of a scannable register as a pseudo-primary output and a data output thereof as a pseudo-primary input,
   wherein said second step includes:
   a first process for partitioning said RTL circuit into plural blocks;
   a second process for selecting, in each of said blocks, registers reachable in a direction from an output to an input of said block by passing merely through combinational facilities as said scannable registers; and
   a third process for selecting said scannable registers among said registers of said RTL circuit so that each block in test attains said easily testable circuit structure in assuming a normal data input of a scannable register as a pseudo-primary output and a data output thereof as a pseudo-primary input.

5. A method of test sequence generation for an RTL circuit, that is, an integrated circuit designed at register transfer level, said RTL circuit having an acyclic structure in test or having a structure in which scannable registers are selected and an acyclic structure is attained in test in assuming a normal data input of a scannable register as a pseudo-primary output and a data output thereof as a pseudo-primary input, comprising:
   a first step of converting said RTL circuit into a timeframe expanded combinational circuit, that is, a gate level timeframe expanded circuit;

a second step of generating test patterns for said timeframe expanded combinational circuit generated in said first step; and a third step of transforming said test patterns generated in said second step into test sequences for the sequential circuit on the basis of data on timeframes including each of primary inputs and pseudo-primary inputs of said timeframe expanded combinational circuit generated in said first step, wherein said first step includes:

an RTL timeframe expanding process for timeframe expanding said RTL circuit on the basis of a predetermined evaluation function;

a logic synthesizing process for converting said RTL circuit into a gate level circuit through logic synthesis; and a test sequence generation circuit generating process for generating said timeframe expanded combinational circuit on the basis of the timeframe expanded RTL circuit obtained in said RTL timeframe expanding process and the gate level circuit generating in said logic synthesizing process.

6. The method of test sequence generation of claim 5, wherein, in said RTL timeframe expanding process, said RTL circuit is timeframe expanded by using a total number of combinational facilities included in each timeframe or the total of the numbers of gates estimated for the combinational facilities in each timeframe as said predetermined evaluation function, with minimizing said predetermined evaluation function.

7. The method of test sequence generation of claim 5, wherein, in said RTL timeframe expanding process, said RTL circuit is timeframe expanded by using a number of timeframes including a pseudo-primary input or a pseudo-primary output as said predetermined evaluation function, with minimizing said predetermined evaluation function.

8. The method of test sequence generation of claim 5, wherein, in said RTL timeframe expanding process, said RTL circuit is timeframe expanded by using, as said predetermined evaluation function, a value obtained by subtracting a number of registers each of which the pseudo-primary input corresponding thereto is included in a timeframe following a timeframe including its corresponding pseudo-primary output from a sum of a total number of timeframes including each pseudo-primary input and a total number of timeframes including each pseudo-primary output, with minimizing said predetermined evaluation function.

9. The method of test sequence generation of claim 5, wherein, in said RTL timeframe expanding process, said RTL circuit is timeframe expanded by using a total number of primary inputs included in each timeframe as said predetermined evaluation function, with maximizing said predetermined evaluation function.

10. The method of test sequence generation of claim 5, wherein said RTL timeframe expanding process includes:
a first process for obtaining a maximum sequential depth of each of primary outputs and pseudo-primary outputs of said RTL circuit;
a second process for sorting said primary outputs and pseudo-primary outputs of said RTL circuit in a descending order of said maximum sequential depths thereof obtained in said first process;
a third process for setting a value obtained by adding one to the maximum value of said maximum sequential depth obtained in said first process as a number of timeframes in timeframe expansion; and
a fourth process for conducting timeframe expansion with respect to said primary outputs and pseudo-primary outputs in accordance with said predetermined evaluation function in the sorted order obtained in said second process.

11. The method of test sequence generation of claim 5, wherein said first step includes a pre-process for grouping, in said RTL circuit, combinational facilities containing none of registers, primary inputs and primary outputs in a path therebetween,
in said RTL timeframe expanding process, the timeframe expansion is conducted with said combinational facilities grouped in said pre-process regarded as one combinational facility, and
in said logic synthesizing process, the logic synthesis is conducted by using said combinational facilities grouped in said pre-process as one unit.

12. A method of test sequence generation for an RTL circuit, that is, an integrated circuit designed at register transfer level, said RTL circuit having an acyclic structure in test or having a structure in which scannable registers are selected and an acyclic structure is attained in test in assuming a normal data input of a scannable register as a pseudo-primary output and a data output thereof as a pseudo-primary input, comprising:

a first step of converting said RTL circuit into a timeframe expanded combinational circuit, that is, a gate level timeframe expanded circuit;

a second step of generating test patterns for said timeframe expanded combinational circuit generated in said first step; and a third step of transforming said test patterns generated in said second step into test sequences for the sequential circuit on the basis of data on timeframes including each of primary inputs and pseudo-primary inputs of said timeframe expanded combinational circuit generated in said first step, wherein said first step includes:

a logic synthesizing process for logically synthesizing said RTL circuit; and a gate level timeframe expanding process for generating said timeframe expanded combinational circuit through timeframe expansion of said gate level circuit generated in said logic synthesizing process on the basis of a predetermined evaluation function.

13. The method of test sequence generation of claim 12, wherein, in said gate level timeframe expanding process, said gate level circuit is timeframe expanded by using a total number of gates included in each timeframe as said predetermined evaluation function, with minimizing said predetermined evaluation function.

14. A method of test sequence generation for an RTL circuit, that is, an integrated circuit designed at register transfer level, said RTL circuit having an acyclic structure in test or having a structure in which scannable registers are selected and an acyclic structure is attained in test in assuming a normal data input of a scannable register as a pseudo-primary output and a data output thereof as a pseudo-primary input, comprising:

a first step of converting said RTL circuit into a timeframe expanded combinational circuit, that is, a gate level timeframe expanded circuit;

a second step of generating test patterns for said timeframe expanded combinational circuit generated in said first step; and a third step of transforming said test patterns generated in said second step into test sequences for the sequential circuit on the basis of data on timeframes including each of primary inputs and pseudo-primary inputs of said timeframe expanded combinational circuit generated in said first step, wherein, in said third step, said test patterns are transformed into said test sequences with one scan path formed by using scan FFs composing a register corresponding to a pseudo-primary output included in one timeframe and scan FFs composing a register corresponding to a pseudo-primary input included in another following timeframe.

* * * * *